United States Patent [19]

Rose

[11] 4,072,851
[45] Feb. 7, 1978

[54] WAVEFORM MEASURING INSTRUMENT WITH RESIDENT PROGRAMMED PROCESSOR FOR CONTROLLED WAVEFORM DISPLAY AND WAVEFORM DATA REDUCTION AND CALCULATION

[75] Inventor: Frederick A. Rose, Fort Atkinson, Wis.

[73] Assignee: Norland Corporation, Fort Atkinson, Wis.

[21] Appl. No.: 670,703

[22] Filed: Mar. 26, 1976

[51] Int. Cl.² .................... H01J 29/70; G01R 23/16
[52] U.S. Cl. ............................ 364/487; 324/121 R; 324/77 R
[58] Field of Search ............ 235/151.3, 151, 150, 235/151.31; 340/172.5, 347 AD; 324 A, 324 AD; 444/1; 324/77 R, 77 A, 77 B, 121 R, 97

[56] References Cited

U.S. PATENT DOCUMENTS

| | | | |
|---|---|---|---|
| 3,317,717 | 5/1967 | Schumann | 235/151 X |
| 3,539,726 | 11/1970 | Bolie | 324/77 R X |
| 3,544,894 | 12/1970 | Hartwell et al. | 324/77 R |
| 3,548,305 | 12/1970 | kaufman | 324/77 R |
| 3,653,027 | 3/1972 | Scheer | 324/121 R X |
| 3,753,105 | 8/1973 | Harzer | 324/121 R |
| 3,790,767 | 2/1974 | Alexander | 235/151.31 |
| 3,836,851 | 9/1974 | Schumann | 324/121 R X |
| 3,872,461 | 3/1975 | Jarosik, et al. | 324/121 R X |
| 3,879,661 | 4/1975 | Collins | 324/77 B |
| 3,882,446 | 5/1975 | Brittian, et al. | 340/324 A X |

OTHER PUBLICATIONS

Built-in Microprocessor Available in Scope; Electronic Design 20 Sept. 27, 1974, p. 25.

*Primary Examiner*—Edward J. Wise
*Attorney, Agent, or Firm*—Andrus, Sceales, Starke & Sawall

[57] ABSTRACT

A waveform measuring and display instrument includes a digital memory unit to store digitized waveform samples for display on an X-Y plotting or monitor oscilloscope. A programmed processor includes an integrated interactive keyboard with user operated data reduction and calculating keys which actuate the processor to execute an appropriate one of a plurality of corresponding program routines in the processor memory to do the appropriate data reduction and calculation on the waveform array or related data. The memory unit and display unit include controllers with data communication provided by hardwire interfacing. The processor writes program tables for the controllers, with the memory unit shared by the data acquisition unit, the display unit and the processor. The interactive keyboard has separate keys for the four basic arithmetic functions and for compound mathematical functions, for operation on full arrays in memory and on individual numbers in special registers. The function keys are directly identified by the known arithmetic and compound function symbols employed in scientific analysis and discussion. Numeric entry keys and cursor positioning keys are provided. A pair of cursors are provided with user motion control keys and machine assist control keys. The processor includes a special sequence memory bank in which the processor stores user established sequences of keystrokes. The processor then, upon demand, directly executes the sequence of keystrokes on the appropriate data arrays and registers.

65 Claims, 8 Drawing Figures

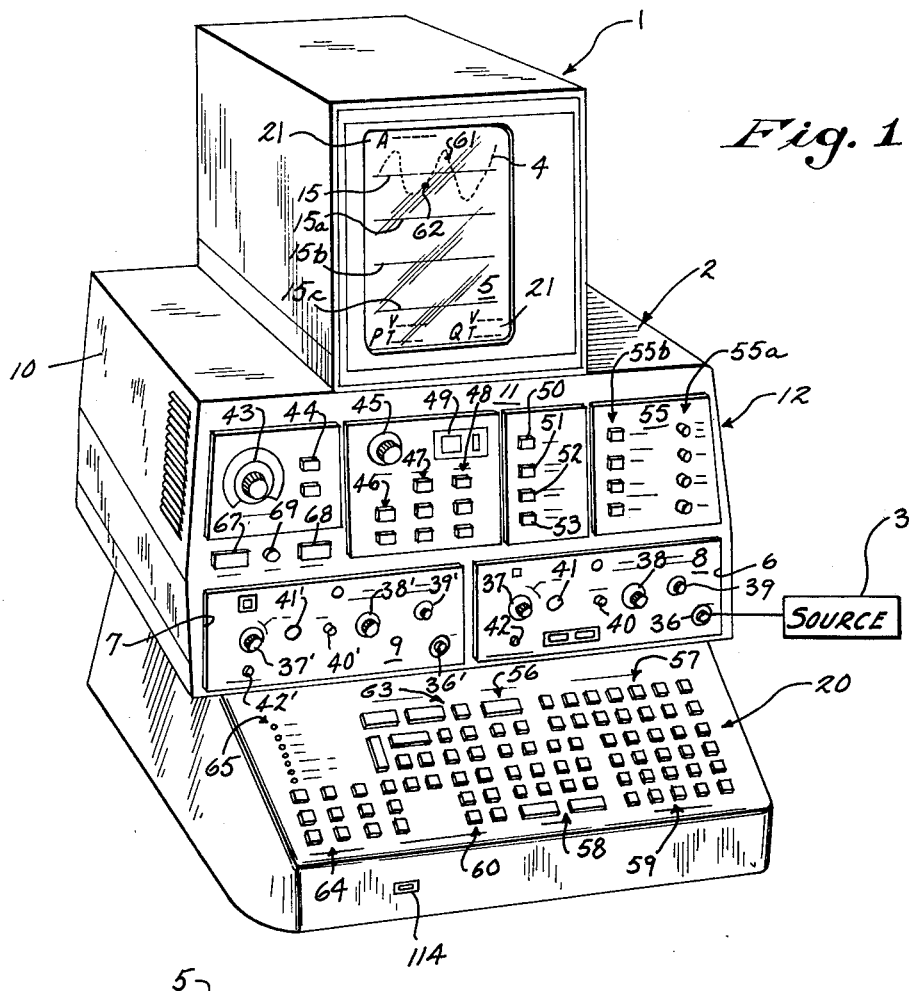
Fig. 1
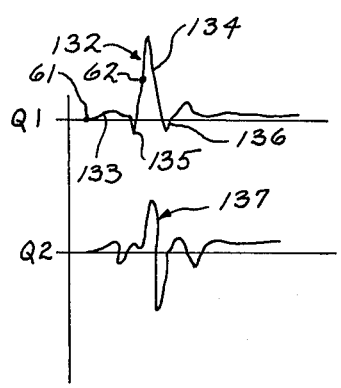
Fig. 4
Fig. 8

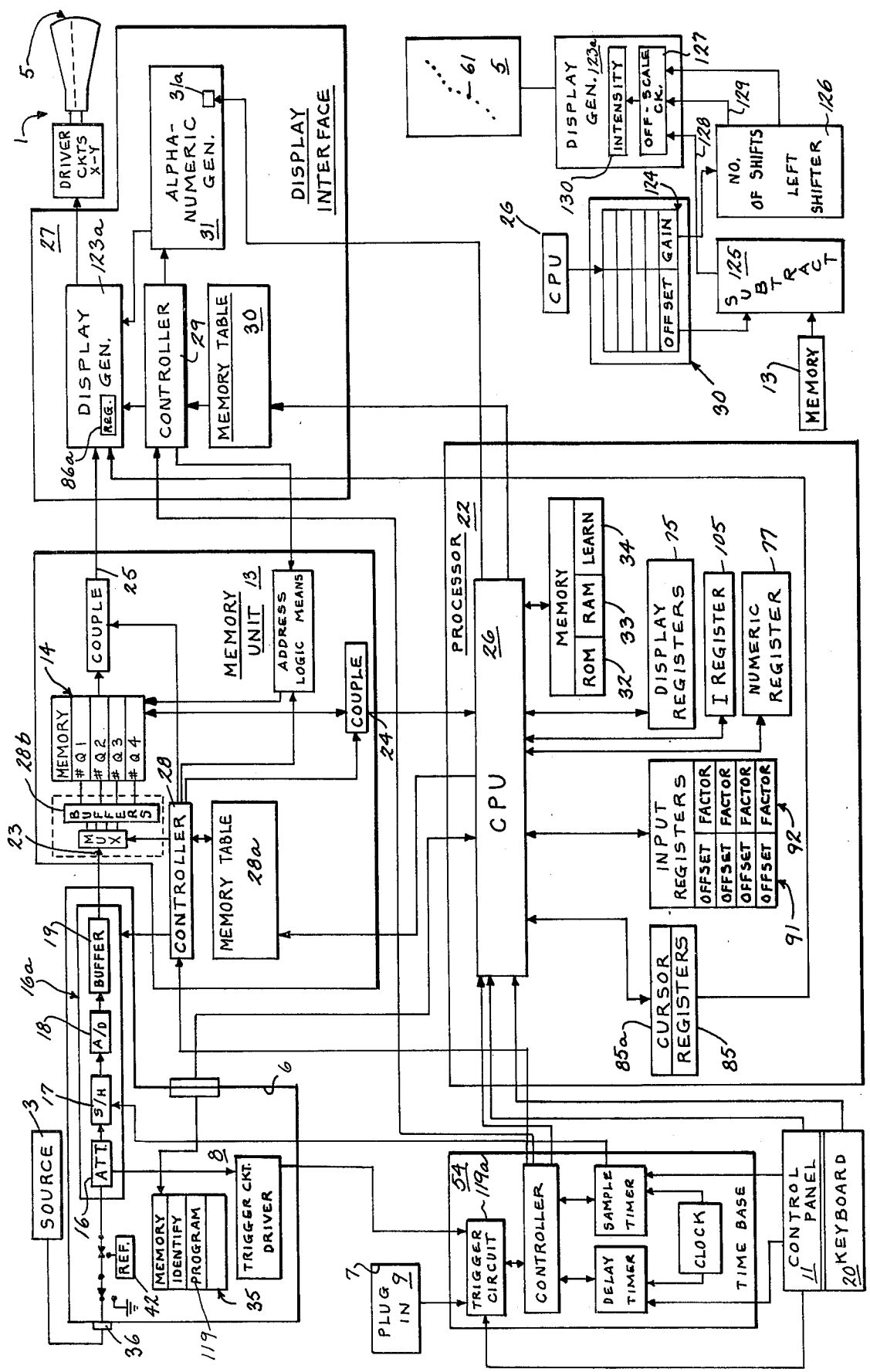

WAVEFORM MEASURING INSTRUMENT WITH RESIDENT PROGRAMMED PROCESSOR FOR CONTROLLED WAVEFORM DISPLAY AND WAVEFORM DATA REDUCTION AND CALCULATION

BACKGROUND OF THE INVENTION

This invention relates to a waveform measuring and analyzing instrument for displaying a waveform signal and related numerical data with user operated means for analyzing said signal, storing the result of such analysis and visually presenting the result of the analysis.

Current scientific analysis of physical changes involves transducing the changes to electrical waveform signals and studying such waveform signals. Oscilloscope devices have been widely employed to visually present the waveforms for study and interpretation of the characteristics and changes.

Recent instrument development has provided for capturing the successive waveforms for analysis and comparison of the changes. Digital oscilloscopes, wherein an analog signal is digitized and stored in a digital memory unit are particularly useful. Individual points on such digitized waveforms can be displayed as digital values and the entire waveform can be reproduced as a digitized representation of the original analog waveform. The input waveform signal is sampled and digitized. Each digitized sample is placed in a separate time slot or location in the digital memory unit. The oscilloscope includes a display driver which is connected to read the memory unit. The display driver appropriately locates the beam on the screen for each location and increases the beam intensity at each location, and thereby reproduces a digitized representation of the waveform. The oscilloscope responds to a suitable trigger or timing signal to initiate acquisition of data. A hold mode control permits holding of a waveform for steady display. A triggered mode control may also be provided to capture and hold the portion of a waveform occurring immediately before a trigger control signal, or a portion of a waveform occurring a selected length of time after the trigger control signal. Successive portions of the waveform may be stored in a plurality of memory means for comparative analysis.

The prior art devices provide highly accurate means for measurement and recording of signal waveforms. Generally, the analysis of the waveform is by visual interpretation of the changes in combination with a manual calculation and reduction of the graphical information. In certain instances, specialized instruments include means for investigation of certain aspects or characteristics of the waveforms; for example, some pulse height analyzer instruments may include a specialized internal analyzing system. The analysis of the waveform, including appropriate reduction and mathematical calculations, otherwise requires the connection of the measuring instrument to separate specialized analyzing means or the recording of the data for subsequent analysis by data reduction and calculating apparatus. For example, digital recording oscilloscopes, transient recorders and the like may be connected to a computer which is programmed for particular processing the data. Specialized personnel familiar with programming and general operation of computers are required to program the computer as many scientists and engineers do not possess the specialized technical skills relating to programming machine language and the like. Further, specialized programming for each analysis can of course be relatively time consuming. Separate computing devices are also expensive and practically provided only by large laboratories and like institutions. Even then, time sharing requirement will normally not always permit adequately rapid access for analysis of the data.

The researcher also is often required to conduct the data acquisition sequence, with limited analysis provided by on-site devices and then transmit the acquired data for computer processing. There is not, therefore, a convenient method of complete on-site analysis of the waveforms. During investigation of changing event, various different investigations may, of course, present still many different possible approaches. Generally, with present measuring devices, each approach involves a reasonably extensive investigation with the usual laborious analysis of the results. A number of different approaches may be undertaken before the several results indicate the most productive detailed study to be undertaken.

Most instruments are constructed to record the incoming signal as an electrical voltage or current. The data is in corresponding electrical units and not directly in units for the particular parameter being measured. The conversions required further complicate on-site analysis.

There is therefore a substantial need for a measurement instrument which permits rapid, reliable capture and visual presentation, plus on-site analysis and reduction of repetitive or single event waveforms and which is sufficiently low cost and flexible for widely differing forms of waveform analysis. Further, the instrument should be readily employable by the scientist, engineer, technician and associated personnel without the necessity of having any detailed technical knowledge of the instrument's internal structure and by a relatively simple and readily understood procedure. The inventor has realized that the prior art approaches have been typically to develop special hardwired instruments. This approach appears to be based upon the designer's reaction to the fact that general analysis and development of different studies and investigation involve highly complex and widely different mathematical equations and procedures. However, the inventor has realized that in fact the reduction of most measured data can be executed with a small number of basic mathematical computational and logical procedures and that with the development of microprocessors, a generalized waveform measuring instrument can be provided for application in the analysis of transduced physical phenomena in which the waveform can be captured, manipulated and displayed for direct, improved on-site analysis. Further, the instrument can be constructed as a relatively inexpensive apparatus for convenient and reliable on-site analysis of complex and sophisticated waveforms with direct on-site data reduction.

In the art of graphic waveform display of monitored information, a selected point on the displayed waveform may be located by the use of a cursor which is a visible mark movable over the waveform to any particular point. The cursor may be in the form of a dot, pointer, cross hairs or the like and is manually positioned on the graph being displayed through a suitable input control. The position of the cursor may be monitored and the X-Y coordinates registered for readout to a suitable display terminal in the device. Except for specialized apparatus such as a pulse analyzer, a single cursor has generally been provided for visual display and positioning on the screen.

Although in the prior art, use of cursors provides assistance in analysis of a waveform, the inventor has recognized that, in fact, a very limited use of the capability of cursor positioning as an aid to total analysis of the graphical information has been made.

The inventor has further, therefore, found and provides a unique multiple cursor system which, in combination with the novel waveform measuring and analyzer instrument provides an extremely useful and practical tool for rapid and efficient analysis of waveforms.

The term waveform is employed herein to generically define any signal which can be captured and digitized for graphical display on a monitor oscilloscope or any other visual display means.

SUMMARY OF THE INVENTION

The present invention is generally directed to a waveform data acquisition and display instrument for measurment of an incoming waveform signal, storage of such waveform signal as a series of digitized samples, with manipulation and mathematical reduction of such waveform data including storage of the result, and display of such waveform and other stored data on a visual display means such as a monitor oscilloscope tube. The instrument is particularly useful for industrial and scientific personnel in technological research and engineering laboratories and the like as a measuring and testing instrument for capture and presentation of repetitive or single events with instrument resident means for meaningful rapid analysis to reach informed conclusions. Generally, in accordance with the present invention, the instrument includes a waveform memory bank coupled to a data acquisition means, a visual display interfacing means and a central programmed processor means with a user operated interactive data reduction and calculating control means integrated into a single on-site apparatus. The user operated control means of the instrument include a plurality of different control elements permitting the user to directly create and generate logical and mathematical program statements and particularly include control elements for the basic arithmetic functions of addition, subtraction, division and multiplication as well as selected compound mathematical functions. Mathematical operations such as derivatives, integrals and other similar operations which are more fully discussed hereinafter and which include combinations of basic arithmetic functions and logical decisions to produce calculated results are generically defined and referred to herein as compound mathematical functions. The data and operator entered numeric constants are used as operands and the basic arithmetic and compound mathematical functions are used as operators and are combined into logical sequences or statements. The logical statements are executed by the processor means, through appropriately provided programs, on the waveform data which is stored in an appropriate time order sample sequence or array in the memory bank, other data derived from the above functions and operations or data otherwise introduced into appropriate memory and storage means of the instrument.

In a practical embodiment, the programmed processor means includes a main program loop which continuously monitors the several tasks of the apparatus and includes internal programs controlling the method of operation of the data acquisition means and the display means in accordance with the user operation of the data reduction and calculation control means. The interactive control means includes a plurality of logic and function control elements for manual selection by the user, each of which invokes an appropriate one of a plurality of corresponding program routines in the processor memory for appropriate manipulation and/or transfer of the stored waveform related data. Generally, the memory bank includes an appropriate controller establishing the connection of the memory unit to the related components. The display means similarly includes a controller establishing the connection to the memory bank and to the processor unit. Data is transferred over hardwire interfacing for rapid transfer, with the processor establishing appropriate tables in the memory and display controllers which control the operative hardwire connections. The memory controller and the display controller operate to provide the necessary high speed transfer of data from and to each of the memory locations or addresses.

More practically, in one novel embodiment of the invention, the data memory unit includes individual ports with a priority connection to the data acquisition means, the display means and the processor; with data acquisition means having the highest priority. The acquisition port is a write-only port, the display port is a read-only port and the processor port is a read-write port. The data memory unit is a high speed transfer system which can be readily shared by the several devices with a continuous acquisition of the waveform and an effective simultaneous transfer of the waveform data as flicker-free displays on a CRT type tube.

The display means preferably includes a high speed monitoring oscilloscope tube means with the interfacing controller connected to the memory display port and to the tube means and also includes a table written by the processor to cover presentation of the waveform data. The display means also includes an alphanumeric character generator. The processor may write an internal memory of the character generator to visually present related alphanumerica data related to the waveform and the results of the calculations established by the interactive keyboard means.

The processor is programmed with a loop to monitor and updata selected registers, the memory controller and the display controller. The processor also has an interrupt means actuated by the interactive keyboard means to invoke programs to process the request through an appropriate processor and to further condition the instrument to execute the logical and mathematical functions identified by the keyboard means.

The memory bank is preferably provided with a plurality of different input ports defining a plurality of memory parts, as more fully disclosed in the copending application entitled "RANDOM ACCESS MEMORY APPARATUS FOR A WAVEFORM MEASURING APPARATUS" of Steven R. Smith and Frederick A. Rose filed on Mar. 26, 1976, bearing Ser. No. 670,890 and assigned to the same assignee. The memory controller means includes memory routing means for direction of the data input signals over the appropriate wired connection into all or any selected memory parts. The waveform data is also preferably stored in fixed point form, with unique offset and gain modifying registers provided in the processor. The processor modifies the stored data in accordance with the register values during display and processing to insure the accuracy and the validity of the processed data, as more fully disclosed in the copending application of Paul J. Kristof and Frederick A. Rose entitled "FLOATING POINT REGISTERS FOR PROGRAMMED DIGITAL INSTRUMENTS" filed on Mar. 26, 1976, bearing Ser. No. 670,722 and assigned to the same assignee.

The interactive keyboard means is perferably provided with a hardwired sample time control means, for user selection of the sampling rate of the input signal. The particular mode of acquisition is also preferably controlled by user operated control means to permit continuous sampling for a live presentation or to permit a triggered capture mode. The keyboard means further includes a display format control means for estalishing display of the memory array or sections versus time or with one section versus another section. The instrument further includes a cursor means which is positioned on the display by keyboard control means for visual selection of points of interest.

The keyboard means, in accordance with this invention, further includes user operated control elements generically referred to as keys or keystroke means for creation of logical and basic mathematical functions by the user which result in the direct manipulation, calculation and reduction of the waveform data within the instrument by the processor. The resulting reduced data, if an array, is stored in the memory array means or, if a single value, is stored in special registers. The results may be visually presented. The keyboard means in particular includes numeric entry keys operable to introduce the decimal digits and numbers into a calculation. The keyboard also includes mathematical function entry keys establishing programmed execution of basic mathematical functions, including addition, subtraction, multiplication and division and compound functions, such as definite and indefinite integrals, differentials, peak-to-peak amplitude calculation, RMS calculations and the like. The user operated control keys also include a general transmittal key for transmission of data or results to user selected storage register or array means.

The keyboard means further permits user established automatic sequencing such key means and thereby establishes the capability of continuous, repetitive reduction and manipulation of the waveform and other stored signals. This permits analysis and visual presentation of widely different forms of data and thus permits a general application and use of the instrument.

In this aspect of the invention, the processor includes a special sequence of memory bank. The interactive keyboard means includes programming keys to condition the processor to store into the special sequence memory bank the sequence of manually activated keystrokes. When appropriately set, the processor executes the sequence of keystrokes on the appropriate data arrays and registers. The data reduction may be automatically applied to a complete array, a particular portion of the memory array, to particular points and to related stored data resulting from a previous analysis of waveforms. The data can, in this manner, be rapidly, repetitively and accurately analyzed.

The various calculation and reduction keys signal and processor, when designed with an interrupt mode, to interrupt its loop and process an actuated key. The processor reponds by invoking a keystroke interpretation program, and if the keystroke is a valid request, establishes a protocol for execution of the requested program and sets a flag to be used later during the main loop processing. The execution is then completed during the main loop processing upon encountering the flag indicating that a legal protocol has been created. The user merely actuates a single function operator key, and if required, an appropriate data selection key or keys for the data on which the function is to be executed, a general transmittal key and a data designation key. The processor then completes the numerous necessary logical and mathematical steps to execute the task, and store the result.

The keyboard means thus includes various mode controls for data acquisition, data display, as well as mathematical calculation and logic functions, with the user providing the necessary selections for proper acquisition, processing and manipulation of the waveform signals. The keyboard employs a conventional mathematical and logic language used in waveform analysis and does not require any technical skill and knowledge with respect to the internal construction of the instrument and particularly the usual complex programming languages employed with computing devices and the like.

The instrument thus constitutes a computing and control means which controls the acquisition and display of waveform data and in particular through the interactive keyboard means provides an on-site resident data and waveform value calculation and reduction means permitting the user to make in-depth analysis of the measured signal or signals. In many applications, no further analysis by the experimenter or other computing apparatus will be required. The waveform data will be presented directly in appropriate engineering units. The processor based instrument is, of course, adapted to interfacing with associated devices such as printers, external signal sources and the like if desired.

In accordance with a significant aspect of the teaching of the present invention, a plurality of cursor means are provided in combination with user operated manual position control means including programmed movement of the cursors to particular locations on the displayed waveform. User operated controls thus provide for selective, manual and visual determined setting of the cursors.

In a significant aspect of this feature, user operated single stroke entry elements provide for programmed movement of the cursor to a local maximum location, or a local minimum location on the waveform with respect to the previous cursor location. In this mode the processor establishes continuous programmed movement over the waveform with analysis of the waveform to locate the selected maximum or minimum location. In addition, a vertical level set element and a horizontal set element are provided and control data storage means into which any display location can be entered from the interactive control means. The cursors can then be so positioned by actuation of the cursor set element. In a multiple array memory and display, a cursor quadrant advance key may be provided for programmed movement of the cursor from one array to a corresponding location in the next array.

Although multiple cursor controls may be employed in any graphical display instrument, the control provides a unique capability in the programmed processor instrument for selected mathematical functions and data reduction as previously described. The individual cursors thus function not only as pointers to indicate data points but further by delimiting certain portions of the waveform permit extensive reduction and calculation with respect to user selected portions of the waveform.

The user operated cursor keys in combination with the user operated compound mathematical function keys permit simple and readily understood execution of waveform analysis functions. For example, the definite and indefinite integrals of the waveform or a selected portion as defined by the cursors can be provided with correspondingly labeled keys. The peak area, the rise time, the root-mean-square and the frequency are other generalized significant functions which can be provided by appropriately labeled individual or single unique keys with the calculations being between the limits defined by the cursors. In addition the cursor keys preferably include a coordinate key and a difference or delta coordinate key.

The differential voltage and time coordinates between two designated cursor positions can be calculated and displayed. This aspect of the invention is particularly significant in connection with a display including a plurality of a data memory segments or arrays which can be separately displayed on different portions of the display means. With the cursors in two different display arrays, the determination of the time separation between events occurring in the two arrays or segments and the detection of the differential voltage gives the time difference between the two cursor positions as if time had started from zero at the beginning of each of the display segments.

The multiple cursor control further is uniquely adapted to rapid analysis of similar but distinctly different curves. Thus, if a repetitive waveform characteristic is known to occur in which changes of less than a basic nature but of substantial significance occur, the programs for the operators and the cursors can be automatically set in a keystroke program to analyze such characteristic changes. In particular, the cursors are programmed to initial positions by the user moving the cursors to visually selected locations and conditions, which are read and placed in the set registers. The processor is placed in a learn mode such that the keystrokes are appropriately stored. The cursor keys are then employed to create a sequence of desired movement on the waveform, with appropriate data reduction and calculation on any desired or necessary point or extent of the waveform. Thereafter, the processor is programmed to automatically execute the stored keystroke program with the cursors properly positioned on successive waveform displays to define the particular data locations and affecting the programmed calculation and data reduction with respect thereto. The instrument thereby produces similar analysis of the characteristic of each waveform.

Thus, in this aspect of the invention, the movement of the cursors are controlled by programming the processor to execute selected keystrokes.

The ability to effect continuous repetitive analysis of the waveform and the changes occurring thereto are particularly significant in allowing on-site analysis of trends thereby indicating to the scientists conducting the tests, various optimum approaches which should be taken. This then should permit the more orderly analysis of waveform data and the like and minimize undesired redundant analysis and tests required before determining the proper investigation leading to final results or conclusions.

The present invention thus provides a highly improved means of data analysis and reduction and particularly in a relatively simple and reliable instrument with the unique multiple cursor means significantly increasing the capability of the instrument for waveform analysis and the like.

BRIEF DESCRIPTION OF THE DRAWINGS

The drawings furnished herewith illustrate the best mode presently contemplated for carrying out the invention and in which the above advantages and features are clearly disclosed as well as others which will be readily understood from the following description of such embodiment.

In the drawings:

FIG. 1 is a pictorial view of a waveform measuring and display instrument with resident data reduction and calculation apparatus;

FIG. 3 is a simplified block diagram illustrating the connection between a resident processor and the waveform measuring and display components;

FIG. 4 is a diagrammatic view of the instrument display in a keystroke programming mode;

FIG. 7 is a simplified illustration of an expansion means for expanding a stored waveform; and FIG. 8 is a simplified cardiac cycle waveform illustrating an application of the instrument in analyzing the significant aspects of the waveform.

DESCRIPTION OF ILLUSTRATED EMBODIMENT

Figure 2:
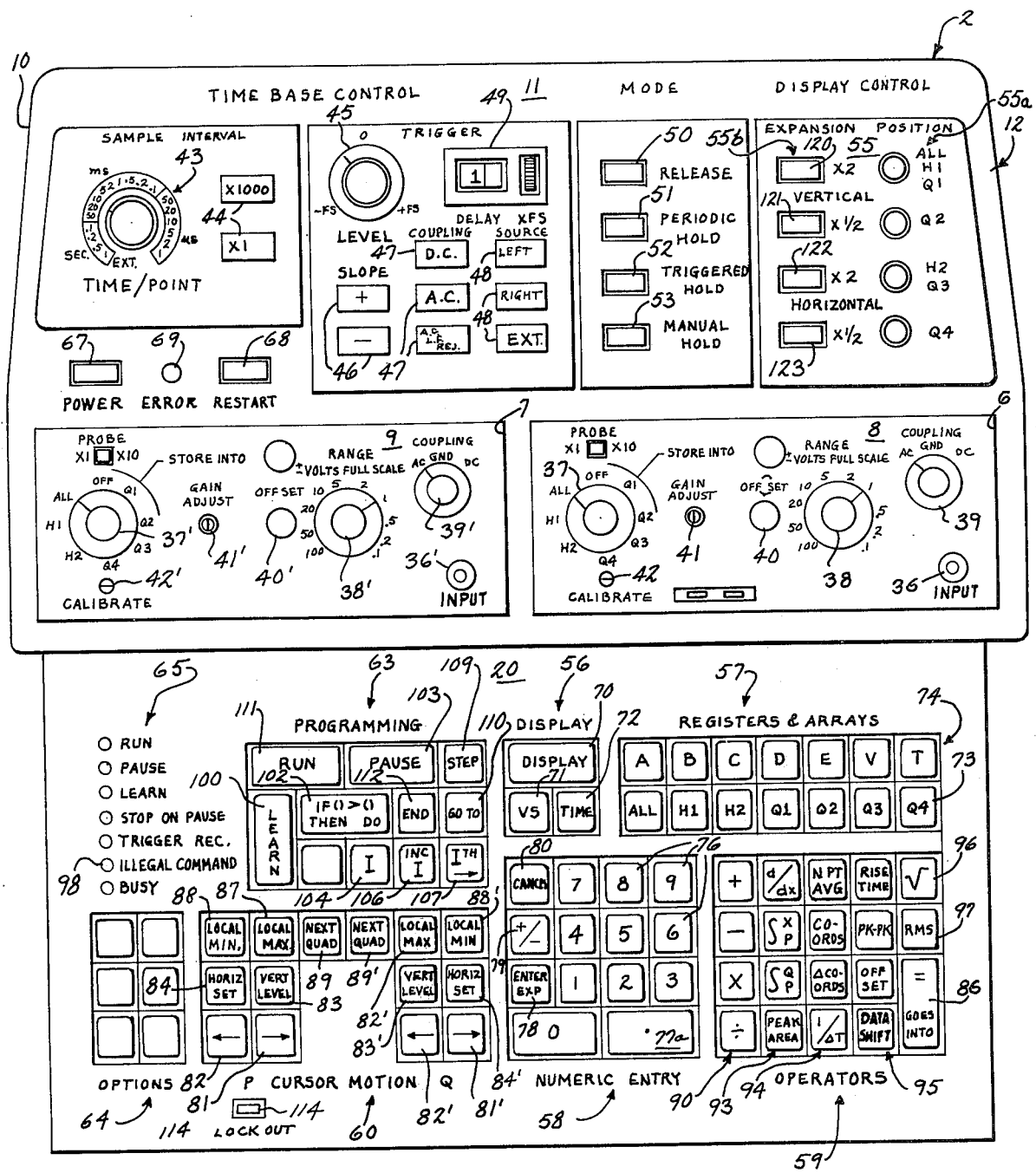
FIG. 2 is an enlarged plan view of the control panels employed in the instrument of FIG. 1 and clearly illustrating a preferred embodiment of user operated controls for generalized waveform analysis.

Referring to the drawings and particularly to FIG. 1, a pictorial view of a waveform display and analyzing instrument constructed in accordance with the present invention is shown including a visual display unit 1 which is preferably a conventional high speed monitoring CRT oscilloscope. The unit 1 is connected to form an integrated element of a programmable processor unit 2 which is adapted to be connected to a waveform source 3 and drive the CRT unit 1 to display related waveforms 4 on the CRT screen 5. The unit 2 includes a pair of waveform data acquisition receptacles 6 and 7 for reception of data acquisition plug-in units 8 and 9 permitting the user to tailor the instrument to the user's present and future needs. The unit 2 is conveniently constructed with an upper housing portion 10 having a front control panel 11. The receptacle openings are located in the lower portion and digital oscilloscope acquisition and display controls 12 are located in the upper portion. The waveform data is digitized into a series of digital equivalents which are stored in a digital memory unit 13, shown in FIG. 3, for subsequent reading and display. As shown in FIG. 3, the digital memory unit 13 includes a memory bank 14 which includes four equal parts with appropriate individual ports for storing of up to four different waveforms, one in each array. The waveforms may be simultaneously displayed on the CRT screen in four vertically spaced quadrants as shown at 15, 15a, 15b, 15c in FIG. 1. The several individual arrays are identified for purposes of discussion by symbols Q1, Q2, Q3, and Q4. Generally, the upper controls 12 in combination with plug-in mounted controls provide user determined time base and mode of sampling and digitizing. As shown in FIG. 3, input waveform signals are impressed on a signal sampling and digitizing interface unit 16a including an attenuator 16, a sample and hold unit 17, an analog to digital converter 18 and a buffer register means 19 for transmittal of the digitized sample to the memory unit 13 in accordance with user operated selection. The digitized samples are stored in the memory bank 14 for selective display on CRT screen 5.

A forwardly extending lower keyboard panel 20 includes a plurality of interactive pre-programmed keys, as more fully shown in FIG. 2, for user operated control. The keyboard 20 provides user selection of the waveform display format and direct user controlled resident data reduction and calculation with respect to the waveform data, including display of such data reduction and calculation with respect to the waveform data as an appropriate reduced waveform display 4 and/or calculated alphanumeric display 21 on the CRT screen 5. The panel 11 and keyboard 20 are preferably integrated into a single housing within which a software programmed processor 22, FIG. 3, is housed to form a single integrated structure. However, if desired, separate elements with direct interfacing to function as an integrated assembly may be employed to thus form an instrument. The assembly, however, is constructed to form a uniquely integrated structure which functions as an instrument and is thereby distinguished from an assembly of differing stand alone devices such as minicomputers with conventional programming and calculators with teletype connections and the like, which have, heretofore been used to produce apparatus for essentially conventional data reduction.

The user operated keyboard keys are connected to processor 22, shown in FIG. 3, for programmed execution of selected functions on the waveform data, with the keys particularly identified by the known function symbols including those related to a compound function such as standard algebraic and calculus functions employed in waveform analysis and reduction.

The memory unit 13 and particularly memory bank 14 includes three ports 23, 24 and 25 which are hardwired to receive and transmit data. Port 23 is a write-only port which is connected to the plug-in receptacles 6 and 7 and to an interfacing digitizing unit 16a located in plug-in units 8 and 9 for writing waveform data in memory locations. Port 24 is a read-write port connected to the central processing unit (CPU) 26 of the processor 22 for communicating with the processor and permitting reduction and calculation of the waveform data. The port 25 is a read-only port connected to the display interfacing unit 27. The memory unit 13 includes a sequence controller 28 which has a memory table 28a connected to and written by the processor 22 to control the data acquisition routing into memory bank 14. In the illustrated embodiment, the digitized data buffer register means 19 is multiplexed to a buffer register means 28b which transmits the samples to the appropriate memory locations in each array Q1–Q4. The memory controller 28 also maintains a record of the memory initial or zero time slot in relationship to the real addresses of the memory bank. Thus, the sampled data is placed in memory bank 14 in the first time slot following that last filled with data such that the zero time slot varies with the physical location of the last input. The controller 28 insures that whenever a particular data location is requested, the proper data sample is accessed. A hardwired controller 28 provides a simple and reliable sequencing of the memory unit. If desired, a separate software programmed processor having a read-write memory bank could, of course, be employed. Thus, "memory table" is generically used to define any type of memory or control means which can itself be controlled by being set or written by the processor 22.

The display interfacing unit 27 similarly includes a sequential controller 29 which reads a memory table 30 to determine the waveform display format. Table 30 is written by the processor 22 to control the waveform presentation in accordance with the user operation of the interactive panels. An alphanumeric generator 31 is also provided for generating display of alphanumeric information on the CRT screen 5. The processor 22 also writes an internal memory unit 31a in the generator 31.

As shown in FIG. 3, the processor 22 includes the CPU 26 which is connected by suitable bus means to the front control panel 11, to the keyboard panel 20 and to the plug-in receptacles 6 and 7. The processor 22 includes a program memory 32 which may be a read-only memory including the basic program loop for the processor and various programs for the several user operated inputs of panels 11 and 20 and hereinafter described. A scratch pad memory 33 is also connected to the CPU 26 for the manipulation of data by the CPU. A special Keystroke memory or "learn" memory 34 is also provided to permit programming of the several user operated inputs. The processor 22 is also coupled to a memory bank 35 resident in the plug-in units 8 and 9. The memory bank 35 contains various identifying and input condition data and may include a software program for execution of data reduction and calculations. The memory bank 35 may thus expand the capability of the processor 22, as more fully described in the copending application of Frederick A. Rose et al entitled "PROGRAMMED CALCULATING INPUT SIGNAL MODULE FOR WAVEFORM MEASURING AND ANALYZING INSTRUMENT", filed Mar. 26, 1976, bearing Ser. No. 670,891.

The several memory tables or banks of the illustrated embodiment are constructed as part of a single sequence of location addresses which are all available to the processor 22 for communication, either for reading or writing as previously noted. Generally, except for the plug-in memory means 35, the several memory means are resident within the processor housing. If any other portion were provided with a separate housing, all or a portion of the memory could be placed therein by establishing connections using the appropriate bus means.

A preferred panel arrangement is more fully shown in FIG. 2 which is a detailed illustration of the front control panel 11 and the keyboard panel 20, and which are generally described for reference in connection with the more detailed description of FIG. 3 and the functional description of the instrument.

The plug-in units 8 and 9 may include up to four signal channels, and a single input unit 36 is shown. As more fully described in the copending application, of Steven R. Smith and Frederick A. Rose entitled "RANDOM ACCESS MEMORY APPARATUS FOR A WAVEFORM MEASURING APPARATUS", as previously noted at page 8, of this application, the four memory parts may be configured into different sections or arrays. Generally waveform data from any input may be stored within the total memory array 14, within any one of the four quadrants Q1 through Q4, or within either of the two half sections or arrays identified by the symbols H1 and H2, where H1 equals Q1 and Q2 and H2 equals Q3 and Q4. An input selection control knob 37 is provided on the plug-in unit. The plug-in additionally includes a sensitivity control knob 38 and an AC - DC - Gnd, coupling control knob 39 with appropriate identification indicia on the plug-in panel. An offset control knob 40 is provided. A gain adjustment control 41 and a calibration output 42 are provided to allow manual calibration of the plug-in. The several controls of the plug-in units 8 and 9 are read by the processor and the waveform data is routed from the input 36 through the appropriate functions and connection units 16, 17, 18, 19, 23, 28b and into the memory bank 14 in accordance with the table 28a as more fully discussed in the previously identified application of Steven R. Smith and Frederick A. Rose.

The sample rate and mode is controlled by time base controls mounted in the upper panel and including a sample interval selection knob 43, with multiplier input buttons 44 to increase the available rates or frequency at which data is sampled; for example, from 1 microsecond per sample to 1000 seconds per sample. A trigger control provides holding of data in relation to a selected trigger signal. The trigger controls include those generally found in oscilloscopes and include a level control 45, a slope control 46, coupling control and trigger source selection control buttons 48 for selecting an external source or the left or right plug-in unit 8 or 9. In the present embodiment a delay thumbwheel switch means 49 allows the user to select a waveform up to one full scale before the triggering signal or up to $9\frac{7}{8}$ full scales after it.

The mode of sampling the waveform data is controlled by a release button 50, a periodic hold button 51, a triggered hold button 52 and a manual hold button 53, as more fully disclosed in the copending application of Russell H. Nord entitled "HIGH SWEEP RATE WAVEFORM DISPLAY CONTROL FOR DIGITAL WAVEFORM DEVICES", filed Mar. 26, 1976, bearing Ser. No. 670,889 and assigned to the same assignee as this application. Generally, release button 50 provides for the continuous taking and displaying of data. The periodic hold button 51 provides for automatic sequenced presentation of a changing waveform at a high sweep rate with the waveform appearing to be at a standstill, as a particularly unique mode which is more fully set forth in the abovementioned application. The triggered hold button 52 provides continuous data acquisition until the trigger signal, as selected by the aforementioned trigger controls, is received. The trigger signal is delayed by the amount of time (in units of full scale displays) set on the trigger delay switch 49 and then applied to stop the acquisition of data. Thus, the screen width of data selected by the setting of the delay switch means 49 will be acquired and held for display on CRT screen 5. Button 53 stops the taking of data and holds the signal then present in memory for analysis. Successive actuation of the manual hold button 53 gives the user one new screen width of data.

The plug-in units 8 - 9 in combination with the time base and mode controls thus provide for capture of repetitive and/or transient waveforms in the best mode for study and analysis. A time base control unit 54, shown in FIG. 3 and more fully described in the previously identified application of Russell H. Nord, is provided to properly sequence the various instrument functions.

In the illustrated embodiment of the invention, the interactive keyboard unit or panel 20 includes a plurality of manually operable keys. The actuation of a key places a corresponding code in an identifying register, not shown, which is read and decoded by the processor 22. The processor 22 thereby determines the software program required for the key and proceeds to execute such program. The keys are identified by conventional symbolic language used by the operator in the acquisition and reduction of data through other conventional processes and devices. The symbolic language permits the user to communicate with the instrument in a language generally conventional for him rather than in a computer language.

Generally, the upper panel 11 and keyboard panel 20 have the various control means grouped for convenient presentation and use. The illustrated control panel 11 includes a display control section 55 having position controls 55a for the several arrays of the graphical display on the CRT tube or screen 5. Expansion controls 55b are also provided for selective independent vertical and/or horizontal expansion of the display.

Additionally, the lower keyboard panel 20 includes a display key group or section 56 to initiate the display of data and a register-array section 57 for selection of the data to be displayed from the memory bank 14 and registers 75, FIG. 3. A numeric entry key group or section 58 provides for introduction of conventional decimal numbers into calculation and data reduction, particularly in connection with a command or operator section 59 for directly commanding execution of selected calculations and reduction of data, which previously was generally only executed manually or with auxiliary devices coupled to the digital oscilloscope. The register-array section 57 also permits storage of the calculated results into a proper array of the data memory or register. The lower panel 20 also includes a cursor motion control section 60 for selective and unique control of the positioning of a pair of cursors 61 and 62 on screen 5. A further unique programming or "learn" section 63 includes a group of keys which, conjointly with all of the other panel keys, permits the user to insert a sequence of keystrokes into the "learn" memory 34 for selective and automatic repeat of such sequence at any time. The sequence can be changed by the operator to any desired combination of keystrokes.

An option section 64 includes keys which are provided to permit specialized user-defined functions or controls such as special interfacing to external devices.

The instrument also includes a bank of indicating lamps 65 which provide a visual indication of certain operating conditions of the instrument. A main power control button 67 and a restart key or button 68 are provided on the upper panel. The restart button 68 permits recycling of the processor through an initialization loop without destruction of the data arrays and related storage means. An error lamp 69 is provided to indicate improper signal acquisition connection or a signal acquisition rate error.

The interactive control, particularly as more fully developed hereinafter, establishes a highly flexible decision-making instrument which is conveniently and readily controlled and operated by technical personnel without requiring special knowledge of computer processing machine language.

The several control sections of the instrument are shown with preferred control keys, labeled in accordance with descriptive identification and symbolic labels. The calculating keys are identified by symbols which will be generally recognized by the user. The general and arbitrary identifying symbols are more fully developed in the following description. The user controls may be of any suitable construction. The terminology keystroke and key will be employed to genericly define such manual control. The controls shown in the drawings are the push button type keys which provide a convenient and practical construction.

More particularly, the lower panel keyboard 20 includes the display format key group 56 having a display key 70 to initiate the display of data calculations and the waveform data in memory bank 14. A versus key 71 and a time key 72 of group 56 permits formatting of the stored waveform date for display with respect to time on the CRT screen 5. The particular portion of the memory bank 14 which will be displayed is selected by the user through a set of memory array selection keys 73 of the register-array group 57. Seven array keys are provided in a horizontal row alignment and appropriately labeled to select the complete memory as a single array, ALL, the first or second halves of the memory as separate memory sections, $H_1$ and $H_2$, or the individual parts of the memory as separate arrays, $Q_1$–$Q_4$, of memory bank 14. The display key group 56 and the array selection key group 73 permit the user to select the mode or format of the waveform display. The waveform data display may appear in either of two formats, that is, versus time, through selection of key 72 or as one memory array versus another. The selection of the "all" array key 73 for display versus time will display the while memory array or bank 14 as a single trace across the CRT screen 5. More than one array may be displayed versus time, simultaneously, by first selecting the display key 70, selecting the array keys 73 for the particular arrays to be displayed, such as $H_1$ and $H_2$, and then sequentially striking the versus and time keys 71 and 72. Two traces will be displayed on the CRT screen 5, with each representing data from the separate half of the memory. Similarly the individual arrays $Q_1$–$Q_4$ can be separately and simultaneously displayed as up to four traces versus time on the CRT screen 5. If one or more of the arrays $Q_1$–$Q_4$ are to be displayed with respect to another quadrant, the user merely selects the display key 70, the array keys 73 to be displayed, the versus key 71 and the second operand or array key 73. Individual graphs of each of the first selected array(s) versus the second operand array will be displayed.

In addition, immediately above the seven array keys 73 are seven register selection keys 74 which are arbitrarily identified by the letter A–E, inclusive, and V and T. The register keys 74 control the selection of value storage registers 75, shown in FIG. 3, and which are preferably floating point registers of a 32 bit width in which large calculated values may be fully stored. The registers 75 are particularly employed with the operator keys of operator group 59 as a source for an operand or as a destination of a calculation as executed and demanded by the operators singly, or in combination with the numeric entry of key group 58, as more fully developed hereinafter. The registers are diagrammatically shown as blocks 75 in FIG. 3 and coupled to the CPU 26 by a read-write bus. Processor 22 writes the result of calculations into the registers 75 when they are selected as a designation. Conversely, when a register is an operand or source, the processor 22 reads the number in the register for use in calculations. In addition, the processor 22 displays the values stored in the registers 75 in response to user selection and actuation of the appropriate register key 74 in conjunction with the display key 70. The register values are normally presented in a preselected portion of screen 5, shown as the upper portion of the screen in FIG. 1.

The numeric entry key group 58 includes individual digit keys 76 for each of the decimal digits 0–9. Actuation of a key 76 results in entering the appropriate value in a numeric storage register 77, shown in FIG. 3. The entered value is employed as one of the operand for the operator function defined by the key group 59. In addition, the numeric entry group includes a decimal point key 77a for entry of an appropriate decimal point in any inserted number. An enter exponent key 78 provides for entry of an exponent selected by proper entry of the numeric entry keys 76. At least one digit key 76 must be entered before operation of the exponent key 78, followed by the appropriate exponent digit key or keys. The numeric entry group 58 also includes a signal change key 79, which changes the sign of a number entered immediately before or after actuation of the sign change key. The sign change key 79, if actuated after the actuation of the exponent key 78, changes the sign of the exponent.

This key group 58 is shown including a cancel key 80, which is operable to cancel any partial statement introduced by any of the key groups of the panel 20, and is also particularly employed in connection with the programming key group 63 to permit editing and changing of a keystroke program, as presently described. Key 80 is grouped with the numeric entry key group 58, wich is located adjacent group 63, for convenience and orderly arrangement on the keyboard panel 20.

Immediately to the left of the numeric entry key group 58 is the cursor motion key group 60 for individually and separately controlling the positioning of each of the pair of cursors 61 and 62. The key group 60 includes identically duplicated individual control keys for each of the cursors 61 and 62 which are conveniently identified by the letters P and Q, particularly for presentation of numerical information on the screen 5 with respect to the location of the cursors. The P and Q cursors 61 and 62 are positioned on the waveform or waveforms to aid in the evaluation of the displayed data and further define precise locations within the memory bank 14 which are used in conjunction with selected keys of operator key group 59 to produce direct data reduction and calculation on the waveform data and the like.

As the cursor keys are duplicated, the key group for the P cursor will be described with the corresponding keys for the Q cursor identified by corresponding primed numbers. The dual cursors control unit illustrates a particularly unique feature generally useful in digital oscilloscopes and similar devices and which is uniquely adapted to expand the capability and power of a waveform measuring instrument with a resident processor as disclosed herein by the present inventor. Generally, in the illustrated embodiment, right and left stepping keys 81 and 82 are provided for movement of cursor 61 in a corresponding direction on the screen 5. Each of the keys operate essentially in the same manner to effect a stepped movement of the cursor 61 in response to depressing the key. A continuous stepping movement of the cursor 61 is obtained if the key 81 or 82 is held down. Immediately above these keys are a vertical level key 83 and a horizontal set key 84. The keys 83 and 84 are associated with individual cursor registers, shown in block diagram 85 and 85a in FIG. 3. The registers are individually set to any desired location within the memory array or bank 14. The registers 85 and 85a may be loaded by transfer of another register including the numeric registers 77 and/or the data display registers 75 by key array 74. Actuating the numeric entry key group 58 enters a value in the numeric register and a generalized transmittal key 86 of the operator key group 59 will load the appropriate cursor register 85. When the cursor register 85 is loaded, the actuation of the related key 83 or 84 causes the cursor 61 to move through the array searching for an array storage location containing a value equal to that set in the corresponding vertical level or horizontal set register. In the illustrated embodiment, the processor 22 writes into the display memory table 30 an instruction to move the cursor location. The display generator 123a means includes a cursor register 86a which when matched to the location of a point being displayed causes that point to be brightened. The horizontal set key 84 sets the cursor 61 to a particular horizontal position in the memory. The vertical level key 83 moves the cursor 61 to the first encountered data value to the right across the screen corresponding to the vertical level value in the register 85.

If the horizontal set value is in excess of the total waveform array locations, the processor 22 responds to such an excess value by moving the cursor to the last data point.

Because of the digital nature of the instrument, the number entered in the vertical set register 85 and the actual location values may not be equal. In the preferred construction, the cursor 61 stops at the first location beyond the value in vertical level register 85. The time position or coordinate is determined by interpolation between the two points on opposite sides of the selected level to provide an accurate time measurement. This provides a relatively simple and accurate determination of the positioning of the cursor.

The actual setting of the cursor location can be determined through use of an operator key group 59, as hereinafter described. If the vertical level register 85 is greater than any storage value in the waveform array, the cursor 61 is moved to the last point of the array.

In addition, a local maximum key 87 and a local minimum key 88 are provided to automatically position the cursor 61 at the local maximum and local minimum position on the waveform on which the cursor is positioned.

If the local maximum key 87 is actuated, the system is set to search in a particular direction. The inventor has also built systems in which the search proceeds in the direction of the data value increase. In the present embodiment, the search proceeds to the right. If the local maximum key 87 is actuated with the cursor already located at a local maximum, the controller 29 is programmed to search to the right for the next maximum data value location. Similarly, if the local minimum key 88 is actuated, the system is constructed to search to the right for the proper minimum data value location.

The waveform being analyzed is never, as a practical occurrence, a smooth curve between the distinct local minimum and maximum points, but rather includes minute excursions from such an idealized curve. The processor 22 functions to ignore the minute excursions as a result of a value averaging program. The local maximum or minimum point is determined by calculating the sum of the individual values of the specified point and a selected number of its nearest neighboring points. Where the instrument provides for expansion, the number of neighboring points used in the sum may be reduced as the waveform is expanded. The program involves comparing each average data location with the average value of the preceding location to smooth the data curve to accurately and reliably move the cursor to the true local maximum and minimum points. If the local extremum is a flat portion, the processor 22 determines its length and places the cursor at the center. The search is completed by locating the desired maximum or minimum or by reaching the last data point in the display array.

Finally, a next quadrant key 89 is provided for automatically positioning the cursor from the waveform in one quadarant to the waveform on an immediately adjacent quadrant of the screen display. For example, if the cursor 61 is in the array display associated with the first quadrant array $Q_1$, actuation of the next quadrant key 89 automatically and correspondingly repositions the cursor 61 in the quadrant display for memory array $Q_2$ and at the corresponding location within that array.

A fuller description of the functioning and use of the cursor control in relation to the other interactive input elements is given in connection with the user operator key group 59 and waveform expansion control group, each of which include keys which employ the cursor positioning and may move the cursors, as hereinafter described.

The operator key group 59 and similar function keys generally require an operand and a destination arranged in logical statement or line. In certain logical lines, the operand and/or destination may be automatically selected by the keystroke related program.

Referring particularly to the operator key group 59, the general transmittal key 86 is operable to transmit the processor calculated values and data to the selected memory including the registers and/or waveform memory arrays. In accordance with this invention, four basic arithmetic function keys 90 are provided for selectively establishing the mathematical functions of addition, subtraction, multiplication and division. The keys 90 can perform the respective functions on operand waveforms in all or any one of the memory arrays of memory bank 14, or data stored in the display registers 75 as well as any other register available which includes the numeric entry register 77. The syntax requires that if both operands are registers, the result must be stored in a destination register. If either operand is an array, the destination must be an array. Further, if a pair of arrays are acted pon such as being multiplied, they must be of equal size and if more than one quadrant exists within the arrays being acted upon, they must have the same time scale.

In addition and subtraction, if both of the operands are an array the key will provide point-by-point addition or subtraction, with appropriate re-scalings. If the arithmetic operation involves only a change of scale or the addition or subtraction of an offset applied to an entire array then the operation takes place only on the input registers 91 and 92. Processor 22 includes a separate set of the data registers for each array. Each set includes an offset register 91 and a factor register 92 in which all of the scaling factors are recorded for each associated array during the acquiring of data and in accordance with any inserted or calculated number, as more fully disclosed in the copending application of Paul J. Kristof et al entitled "FLOATING POINT REGISTERS FOR PROGRAMMED DIGITAL INSTRUMENTS", as previously noted at page 8 of this application which permits storing values up to approximately $10^{\pm 38}$.

Thus, where the operands involve an array and a register, the offset and factor register for such array are increased or decreased while the array data remains unchanged. The resident basic mathematical functions, for example, may be employed to properly scale the input waveform for manipulation and display in units of the phenomena being measured. Thus the digitized signal is that of a transduced voltage signal, which is not usually properly scaled to the actual units but which is readily coverted to a properly derived unit by modification with an appropriate constant.

In multiplication and division of an array by another array, processor 22 establishes point-by-point multiplication or division with appropriate rescaling for presentation on the CRT screen 5. When an array and a register are employed as the operands in a multiplication or division, the result is dependent upon whether the register is equal to zero, whether the register is equal to one, or whether the register is less than zero or greater than zero, but not equal to one. When the register is equal to zero, multiplication results in changing the array to all zeros. When the register is equal to one, point-by-point multiplication is performed with rescaling of the data array. When the register is less than zero, the factor and offset registers are multiplied by the absolute value of the register content and array-stored data values are inverted about zero (complemented). If the register is divided into an array, the factor register and the offset register are changed accordingly by division of the factor and offset values respectively by the register content. The waveform data array in calculation involving a multiplication by less than zero generates a new array which is the complement of the original waveform array.

In addition to the basic arithmetic functions, special compound function keys are provided on the keyboard within the operator group 59. A series of keys 93 provided for execution of various calculus functions including calculation of the derivative, the definite integral, the indefinite integral and the peak area of a waveform stored in the waveform data memory. Each key 93 is directly identified by the well-known mathematical symbol for the function which is executed by depressing of that key and presents normal conversational language to the user. This significantly simplifies the use of the instrument and permits rapid, accurate data reduction.

For example, to calculate and store the derivative of a waveform, the operator derivative key 93 is actuated and one memory array key 73 is actuated to select the memory array to be operated upon (i.e., which array should have its derivative taken). Then the general transmittal key 86 and a destination array key 73, to select the memory array into which the calculated waveform derivative is to be placed, are actuated to complete the statement. If more than one quadrant is involved in the selected memory array, they must all have the same time scale and the operand and destination array must be of equal size, that is, include the same number of quadrants or locations. The processor, upon reading the total statement, executes the appropriate software program for the selected operation on a waveform and, in particular, for the derivative automatically calculates a new value for each location of the destination array by calculation of the difference between successive locations and dividing by the time interval between the two locations.

The definite integral key 93 automatically calculates and stores the definite integral of the waveform from P cursor 61 to Q cursor 62. The cursors 61 and 62 may be positioned by user operated continuous motion keys 81, 81', 82 and 82', by the preset cursor register keys 83, 83', 84 and 84' or by the local maximum and minimum keys 87, 87', 88 and 88'. After properly locating the cursors 61 and 62 on the waveform, the user then merely strikes the definite integral operator key 93, the transmittal key 86 and destination register key 74 to complete the logical statement or line. The processor 22 upon cycling to a command execution stage executes the definite integral software program to calculate the definite integral and store the result in the designated register 75. If the cursors are not in the same quadrant, the quadrants must have the same time scale. The definite integral calculation between the cursors results in a floating point number which is stored in the appropriate destination register 75.

The indefinite integral is similarly derived by actuation of the indefinite integral key 93, a source array key 73, the general transmittal key 86 and an appropriate destination array key 73. Once again the operand array and the destination array must be of equal size; that is, be of the same number of quadrants and if more than one quadrant is involved they must be all of the same time scale. The indefinite integral is determined from the P cursor 61 which defines the initial or starting point of the calculation if it is present in the source array. If the cursor is not present in the source operand array, the starting point for the calculation is defined as the first location in the array and the total array will be subject to the calculation.

A peak area key 93 calculates and stores the area under the curve of a waveform existing above an imaginary straight line drawn between cursors 61 and 62. The processor software program calculates the results by subtracting the area under the lne from the total area. The area under the line is calculated by calculating the rectangle of a height of the vertical value of the first cursor and a width of the horizontal distance between the cursors plus the triangle of the same width and the base equal to the difference in the two cursors. The peak area value is a floating point number which is stored in a selected register. The syntax therefor requires actuation of peak area key 93, the general transmittal key 86 and a designation register key 74.

An adjacent set of keys 94 provides for special data reduction including an "N" point averaging key for smoothing the waveform of a selected array. The number of points over which to average may be derived from a register key 74 or a numeric key 76 from key group 58 and its associated register 77. In a practical embodiment, the program requires an odd value of "N" less than 16. The smoothing action is performed by the program calculating a sliding window average on any selected number of array location values specified by the first operand number, which is rounded up to the nearest odd number. This provides a means for smoothing a highly noisy signal to more accurately represent the basic wave shape for analysis.

Coordinate and delta-coordinate selection is provided in the special keys 94. The actuation of the coordinate key 94 provides for display of the current location of the P and Q cursors 61 and 62 on the lower portion of screen 5. The actuation of this key 94 also places the current location values for the P cursor 61 in the V and T registers 75 of the key group or section 74. Each time the coordinate key 94 is depressed, the current values for the P cursor are stored in the V and T registers 75.

The coordinate positions of register V and T are also written into the alphanumeric memory 31a and displayed along the bottom portion of the screen, as at 21.

The delta-coordinate key 94 similarly functions on the cursor locations and selects a mode for register display on the CRT screen 5. In the Δ CO-ORDS mode, the values at the current location of cursor P and the difference in values between cursors P and Q can be observed in the V and T cursor coordinate displays on the CRT (value in V and time in T). Pressing the Δ CO-ORDS key stores the displayed values for Q-P in the V and T registers. The key must be pressed each time new values are desired in the V and T registers.

The final cursor related key 94 in the operator key section 59 automatically calculates the inverse of the time difference between the cursors 61 and 62. If the cursors are located on corresponding portions of adjacent cycles of a periodic waveform then the inverse of that time difference is the frequency of the waveform. Thus, the syntax requires depressing of the operator inverse time key 94, the transmittal key 86 and an appropriate register destination key 74.

In an adjacent key row 95 of operator key group 59, a rise time operator key 95 is provided which calculates the rise or fall time of a signal existing between the P and Q cursors 61 and 62, and transmits the value to a selected destination register 75. The rise time operator key 95 is programmed to calculate the time between the 10% and 90% points of the transition delineated on the waveform by the two cursors.

A peak-to-peak operator key 95 is provided to automatically determine the absolute maximum and minimum values on the waveform between the P and Q cursors 61 and 62 and to store such peak-to-peak value in an appropriate selected destination register. The program compares all data memory locations between and including the cursors to locate the values. The program also moves the cursors to such extreme positions, with the P cursor 61 moving to the maximum value location and the Q cursor 62 to the minimum value location. If there are several locations with maxima and/or minima values, the cursors 61 and 62 move to the leftmost point or points as viewed on the CRT screen 5 having the correct values.

As described above, the operator key group 59 includes a plurality of cursor related operator keys, some of which in the illustrated embodiment directly invoke the insertion of the cursor location data while others provide for user operated inputting by operation of the cursor key group 60. All of the cursor keys of key group 60 can also be introduced into a keystroke program, as hereinafter described. The combination of the multiple cursors with the operator keys therefore further simplifies the use of the instrument for waveform analysis.

The operators further include an offset register key 95 by which the offset value of one of the data arrays may be summoned for storage in a selected register for display or manipulation.

The final key in the column, is a shift key 95 which is adapted to shift an array of data in memory bank 14 to the right or to the left. The syntax employs an operand which is either a register or a number from the numeric entry group 58 followed by actuation of the shift operator key 95 and an array operand. The processor 22 then shifts the data to the left or to the right. The data shifts to the right if the first operand is positive and to the left if the first operand is a negative value.

Finally, a square root key 96 and a root means square key 97 (RMS) are provided for automatically calculating the square root of the value in an array or the value in the register. The syntax employs selection of the square root operator key, and operand which may by an array or a register, the general transmittal key 86 and an appropriate destination, which is an array or register depending upon the first operand.

If the operand is a register, the square root is calculated for the value and stored as a floating point number in the selected register. If the operand is an array, the square root is calculated for each location in the array and is stored in the corresponding location of the destination array.

The root-mean-square key 97 automatically calculates and stores the RMS value between the cursors 61 and 62. The syntax requires selection of the RMS key 97, the transfer key 86 and an appropriate destination register key 74. Once again if the cursors 61 and 62 are in different quadrants the they must have the same time scale. The processor automatically calculates the RMS value by summing the squares of the values of locations in the array between the cursors 61 and 62 and dividing by the number of samples and taking the square root of the result. The calculated value is stored as a floating point number in the selected register 75.

Under error conditions, error messages may be displayed on the CRT screen 5 and the illegal command "light" 98 of bank 65 illuminated. Generally, an error will arise as a result of an attempted operation which does not comply with the rules for the particular operator key and the displayed message may indicate the nature of the violation.

The programming key group 63 provides unique user operated entering, editing and subsequent execution of the keystroke program placed in the "learn" memory 34. The key group 63 includes keys which are uniquely related to programming but which may also be employed during other modes of instrument operation.

The key group 63 includes a "program" or "learn" key 100 which conditions the processor 22 to enter a program input loop upon sequencing to the programming mode stop as hereinafter described.

Entry of the programming state, presents the program statements upon the CRT screen 5, as diagrammatically shown in FIG. 4, for editing of an existing keystroke program or of a new program as it is introduced. The processor 22, as shown, presents statement lines on the screen 5 with a pointer 101 to the statement being inserted or edited. Each line is a single logical statement which is developed by user operation of the keys. As the statement is being developed, it is first presented on the upper portion of the screen 5 as shown in FIG. 4, and then when in the learn mode is placed in the "learn" program. Actuation of the "learn" key 100 permits storing in the location of the "learn" memory 34 any valid sequence of keystrokes.

The user thus enters a desired statement by sequential actuation of the interactive keys of the panel 11 and 20, each of which develops a keystroke input. Upon completion of a valid statement, the processor 22 stores the statement and automatically indexes to the next location as indicated by the edit pointer 101.

The programming key group 63 includes a comparator key 102 which permits insertion of the decision making step into the keystroke program. This key is only active in the program state.

The key group 63 also includes a "pause" key 103 which inserts a pause statement in the keystroke program and during RUN state is operative to set the program to pause at such inserted pause statement. This permits temporary interruption of the program to permit user operated control calculation or other operations within a keystroke program. The key group 63 is also provided a special array location index I register key 104 which controls an integer register 105 and can be employed as a destination or a source in a logical statement.

The key group 63 also includes special control keys for the I register 105 including an I register increment key 106. In the program state, operating key 106 places a statement in the program to increment the I register and thus when running a stored program, the I register 105 will be so incremented.

A $I^{th}$ key 107 places a statement in the user program which when executed transfers a register value into an array location or an array location into a register respectively, with the particular location within the said array specified by the contents of the I register.

A step key 109 permits manual stepping forward in the keystroke program for editing when in the program state and allows single step execution of programs in the program memory when in the run state.

The key group 63 further includes a generalized "go to " key 110 which, in the program state, permits the selection of any logical line in the keystroke "learn" memory array 34. The user may thus move the pointer 101 to select any logical line for purposes of changing an existing program. This key 110 may also be inserted as a statement in a keystroke program for automatically stepping to any desired location in such program.

A "run" key 111 of group 63 allows invoking a keystroke program stored in the memory bank 34.

An end key 112 of the group 63, when in the run mode, permits the user to terminate any existing execution by the processor 22 of a keystroke program. During learn mode the "end" key functions as a terminator for the alternative sequence of keystrokes in the "IF" statement.

After a complete keystroke program has been introduced, the "learn" key 100, which is dual functioning, is actuated which returns the processor 22 to a normal state in which the basic program loop is re-entered and normal processing resumes.

The keystroke memory bbank 34 is of a definite preselected length. If a first keystroke program does not fill memory 34, one or more additional keystroke programs may be introduced into the memory bank 34. To execute any program other than the first, the user actuates the "go to" key 110 and numeric entry keys 76 for the first statement of the desired keystroke program. The "run" key 111 is then actuated and the processor 22 upon entering an execution process will address such location as the first step in the program for execution.

The cancel key 80, located in group 58, when in a program state will delete the statement located in the program location identified by the edit pointer 101.

As previously noted, certain of the generalized keys of the program group 63 may also be employed during other instrument states of operation.

Generally, the instrument is in a normal sequencing loop state, a program state, a run state or a pause state. Thus, the "learn" key 100 converts the processor between the normal and program states. The run key 111 establishes execution of the keystroke program beginning at statement 1 if actuated along or at any specifically directed location in the keystroke program memory 34 if actuated after the entry of a number from the numeric entry section 58. The pause key 103 establishes a pause in the run state if a "PAUSE" statement is present in the keystroke program being executed and functions as previously described in the learn state.

The step key 109 is also operative in the run state to create a pause condition upon completion of a current program statement, and if in a pause state causes execution of a single logical line of the keystroke program. When in the pause state, the instrument can be returned to the run state by depressing run key 111 or to the normal state by depressing the end key 112.

The I register key 104 is operative in the normal and pause instrument states to designate the I register 105 as a source or destination in a transfer syntax. Similarly, the I increment key 106 increments the I register 105 by 1 in these two states. The $I^{Th}$ key 107, in the normal and pause states, provides for transfer of an array location into a register or of a register value into an array location, with the array location identified by the I register.

The cancel key 80 is operative in the normal or pause state to cancel the program statement being entered by the user.

The indicating lamp bank 65 in addition to the illegal command lamp 98 includes status lamps identifying the several states of the instrument. The several lamps are controlled by the processor 22. An error condition may also be indicated by an appropriate written message on the CRT screen 5.

The various keystrokes as executed by the user are processed by the programmed processor 22. Each keystroke in a logical sequence is stored until a complete statement has been made, at which time the processor 22 is signaled to execute the required calculation, data reduction or waveform modification as defined by such statement. The processor 22 executes the required process under its program routines provided in the ROM (Read-Only Memory) 32.

A lock unit 114 is preferably also provided to lockout or disable all of the interactive keys of the instrument except for the Run key 111 and the Pause key 103. As a result, the processor 22 can only be actuated to execute the program in the "learn" memory bank 34.

This aspect of the keystroke programming system is particularly adapted to on-line production testing of devices and the like. The user can couple a typical inline production device to the appropriate signal input or inputs of the instrument and establish a particular sequence of keystrokes to analyze one or more characteristics of the device. The keystroke sequence can, of course, be placed as an executable program in the "learn" memory bank 34. Actuation of the lock unit disables all but the "Run" key and the "Pause" key.

The instrument is now set and locked for on-line testing with the testing personnel only able to stop, start and interrupt the analysis of a device. The testing personnel does not have to have any other knowledge of the system operation, other than to be informed of the waveform and/or data display which requires special attention or action.

The lock unit may be a simple signal switch means having a slotted operator on the instrument housing which if desired, may require a unique key, not shown, to operate the switch means. Once locked, the key is, of course, removed to prevent unauthorized changes of the instrument setting.

Referring to the block diagram of the instrument shown in FIG. 3, the waveform data processing is briefly summarized as follows.

The memory unit 13 is shared by the data acquisition units 8,9 the display interface unit 27 and the processor 22 in accordance with the selected priority of data acquisition. The processor 22 is programmed to monitor the data acquisition plug-in unit and the control panels 11 and 20 to write the appropriate memory tables 28a and 30 for data acquisition and display.

Figure 5:
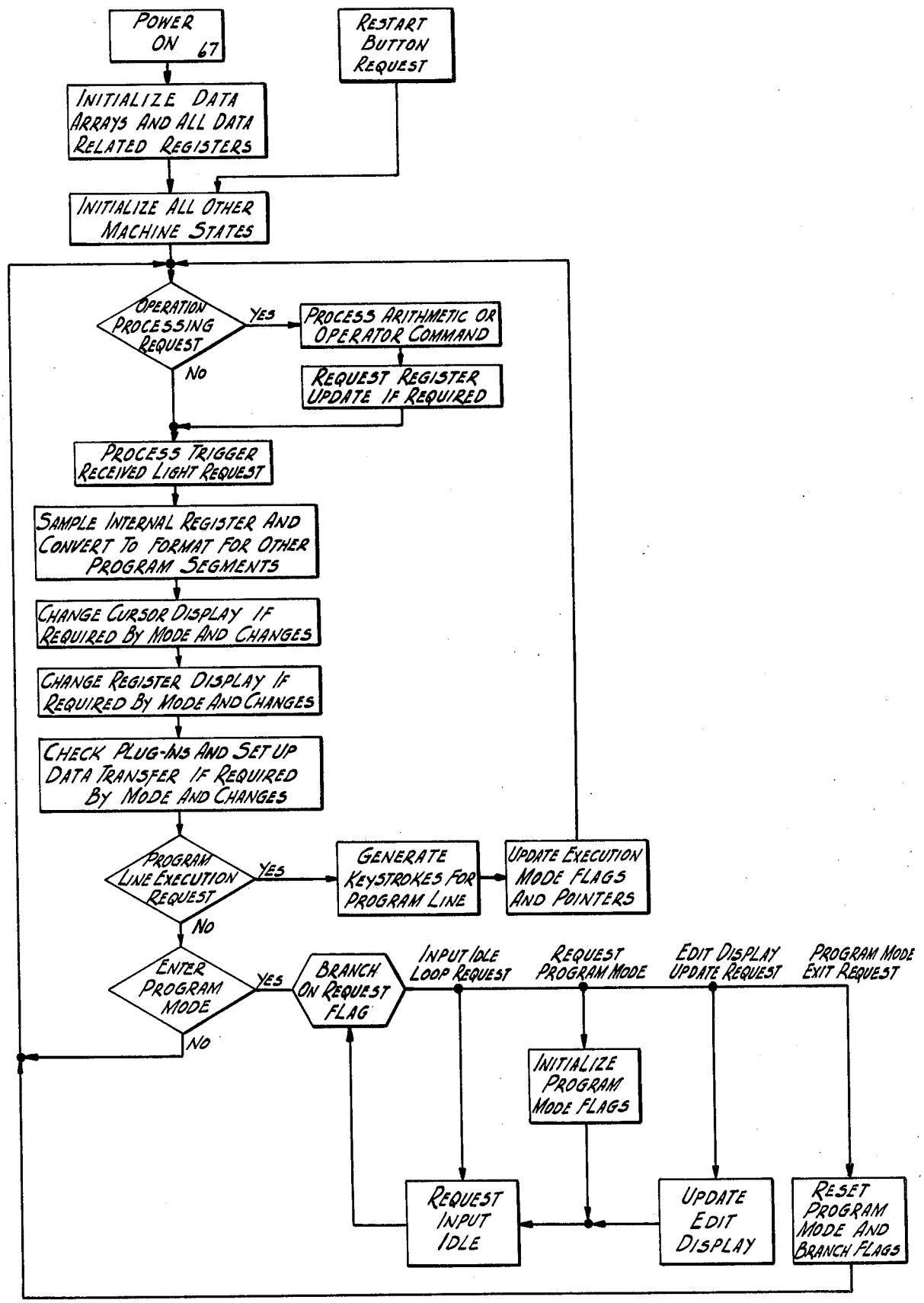
FIG. 5 is logic flow diagram illustrating the sequence of a main processing loop employing an interrupt means for responding to user operated inputs.
Figure 6:
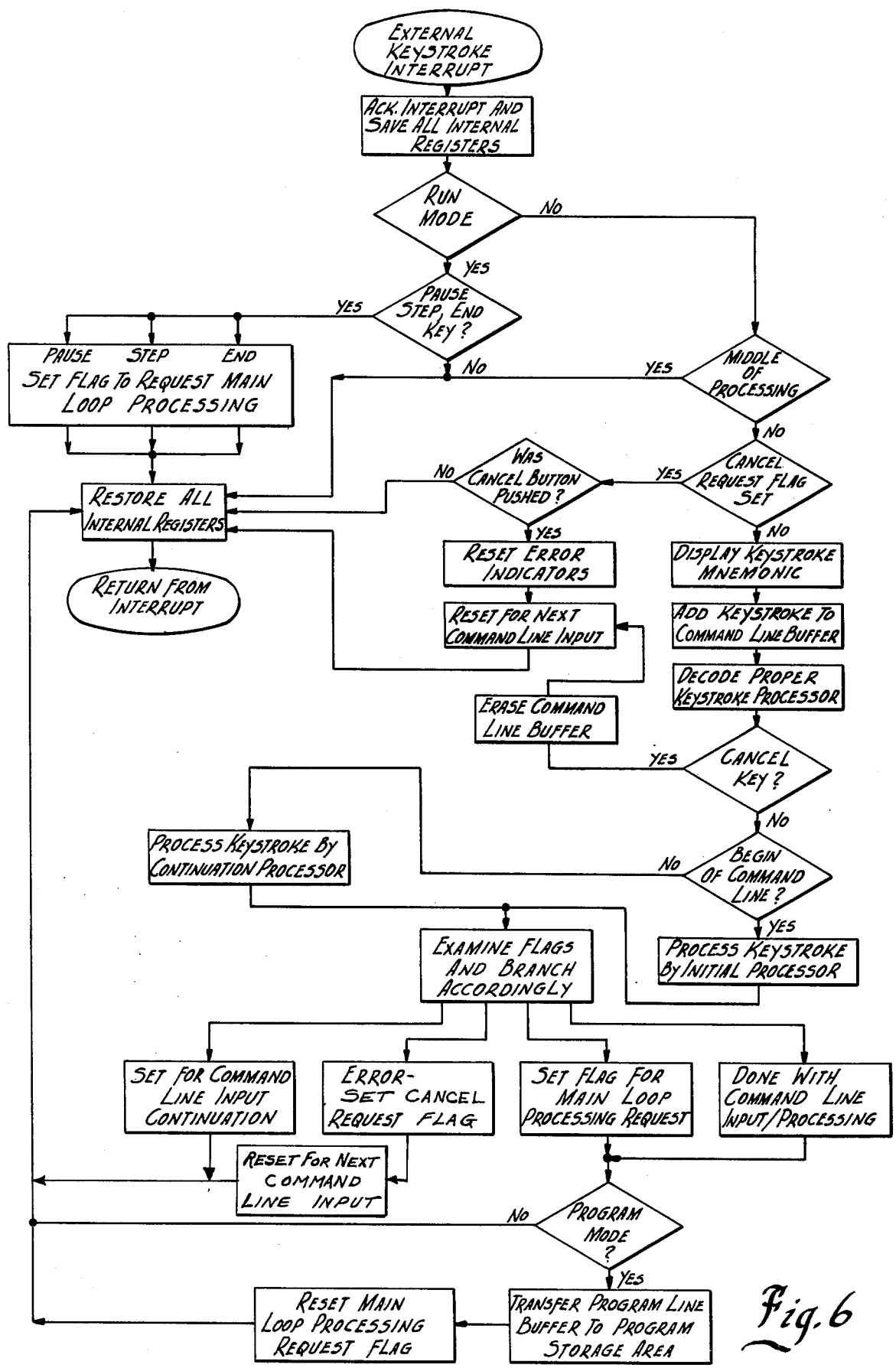
FIG. 6 is a logic flow diagram illustrating the sequence of the processing steps for the acknowledging and processing user operated input.

In the illustrated embodiment, the processor 22 is sequenced through a main processing loop as shown in FIG. 5 and keyboard inputs are serviced on an interrupt basis, as shown in FIG. 6. In FIG. 5, the processor 22 is activated upon turn-on of power by control button 67 to establish a first sequence in which the data arrays and all data selected registers are initialized. The other machine states are then initialized by a second sequence. The restart button 68 is connected to activate the second sequence and thereby permits restart of main loop processing while maintaining waveform nd related data.

The processor 22 then proceeds to determine whether a processing request exists. Such request is created by completion of an arithmetic or operator statement as a result of actuation of the interactive keys, as described with respect to FIG. 6. If the request exists, the command is processed to complete the required data reduction and calculation. If required, a register update request will also be entered for the transfer of the results to the appropriate destination storage register 75. If processing request was not present, or after completing servicing such a request, the processor 22 processes a trigger light request. A trigger light request is generated by the recognition of a trigger event by a trigger circuit 119a of unit 54, as more fully described in the previously identified application of Russell H. Nord. The trigger received light in group 65 informs the operator of such event.

The processor 22 then proceeds to read the internal registers and convert to appropriate format for other program segments. The cursor and register displays are then sequentially changed if the mode or other changes have been made. The processor 22 next checks the associated plug-in units 8 and 9 by reading the several memory addresses in the plug-in resident memory 35 to determine the characteristics or type of plug-in unit. The appropriate memory table 28a is written for data transfer if required by mode changes or the like. The presence of a plug-in resident software is appropriately integrated into the processor's program.

Referring to unit 8, processor 22 first determines whether the plug-in unit 8 is a conventional signal conditioning type or is a special calculating type such as disclosed in the previously identified copending application of Frederick A. Rose et al. The number of channels is checked for proper input to the arrays of memory. Thus, with four memory arrays $Q_1-Q_4$, up to four channels may transmit signal waveforms, with each being coupled through proper writing the routing table in the controller memory table 28a. The setting of the attenuator 16 is read. The offset is obtained by grounding the attenuator input and storing the digitized offset voltage, if any, in the offset register 91. The attenuator setting is stored in the factor register 92 and the offset setting is stored in offset register 91 so that the data as stored in the memory bank 14 can be properly scaled for calculation and display. The processor 22 also reads the presence of a reference input 42. The calibration program is resident in the plug-in memory unit 35 and is automatically executed by the processor 22 at the end of the data sample and the appropriate calibration values stored.

If the plug-in unit 8 is of the unique calculating type, the plug-in memory unit 35 includes a software program section 119 defining a software program for execution by the processor 22, either upon termination of data acquisition, or the software program may demand execution in response to a separate keystroke input. The processor 22 would then only execute the extra software program in response to such keystroke input, as more fully developed in the previously identified application of Frederick A. Rose et al.

The processor 22 next determines whether the instrument is in the "Run" state and a program line execution request therefor exists. If the instrument has been placed in the "Run" state, the processor 22 sequentially executes the stored program by generating keystrokes for the program line and updating the necessary mode flags and pointers, and then returning to the starting point of the main loop. The processor 22 again steps through the sequence just described to process all steps in the "Run" program.

If the instrument was not in the "Run" state, the processor 22 is then programmed to decide whether a keystroke programming or "learn" state has been requested by the user operation of the learn key 100. If not, the processor steps to the start of the main loop and again starts the same sequence described above. If an entrance to program mode was requested, the processor branches to the program mode, as shown by the "Branch on Request Flag" logic illustration in FIG. 5.

If the "learn" key 100 has been actuated, the appropriate controls are set such that the main processing loop is interrupted until such time as the learn key is actuated a second time to return to the normal state. Thus, the instrument remains in a wait or "learn" mode, with the learn lamp in group 65 illuminated.

In the "learn" state, the processor 22 receives one of four requests including (1) an input idle loop, (2) Program Mode, (3) Edit Display Update, and (4) Program exit. The idle loop request provides a short sequence which waits for receipt of one of the other three requests. The program mode request results in initializing the program mode flags and a return to the idle loop. The edit display request results in the updating of the edit display, as shown in FIG. 4, and a return to the idle loop. Finally, the exit request first causes the reset of the program mode and branch flags and then return of the processor to the normal state.

The processor 22 thus sequences through the several loops as shown in FIG. 5 in continuous, repetitive cycles. The processor 22 services keystroke inputs on an interrupt basis in the illustrated embodiment of the invention.

Whenever the interactive keyboard or the upper panel mode or display control elements are operated, an interrupt flag is set and the processor 22 processes the keystrokes to construct a complete legel and logical statement or to indicate the error in the statement, as shown in the sequence diagram of FIG. 6. The processor 22 immediately establishes an intitial acknowledge program to acknowledge the interrupt, and, if the processor 22 is processing a program, saves the information in the internal processing registers in a storage register section for subsequent restoration of the program. The processor 22 then checks on whether a programmed "Run" processing had been interrupted and if so branches to service keystrokes or inputs which can be inserted in a "Run" program.

In the illustrated embodiment, the pause, step and end keys 103, 109 and 111 can be employed to change the previous program sequence. The processor 22 determines whether one of these three keys created the interrupt, and, if yes, proceeds to set the appropriate flag to request the main loop processing. The processor 22 will then have completed the acknowledgement and processing of such interrupt and will return from the interrupt by restoring the internal registers.

If the key interrupt being serviced was not one of the three allowable keys, the processor 22 ignores the keystroke request by restoring the internal registers and returning from the interrupt.

If not in "Run" mode at the time of an interrupt, the processor 22 proceeds to determine whether a logical statement was being processed at the time of the interrupt. If so, the internal register is restored and hence the keystroke is effectively ignored.

If the processor 22 was not in the middle of processing, the cancel request flag is checked and if set, processor 22 branches to determine whether the cancel key 80 was pushed. If not, the processor restores the registers and returns to the main loop processing. The cancel request flag is a flag set by the processor when it encounters an erroneous input. If the "cancel" key 80 was actuated, the processor 22 execution branches to sequentially reset the error indication, reset the instrument for the next command line input, restore the internal registers and return from the interrupt.

If the cancel request flag was not set, processor 22 proceeds to process the interrupt as follows. The processor 22 first displays the keystroke mnemonic and adds the keystroke to a program or command line buffer. The processor then proceeds to decode the appropriate keystroke processor for the particular key causing the original interrupt being serviced.

The processor 22 now decides whether the key was the "cancel" key 80. If yes, the processor 22 erases the command line buffer and steps to the reset for next command line input for return from the interrupt. If no, the processor 22 continues to process the key interrupt. The processor 22 proceeds to determine whether the keystroke interrupt was the first keystroke in a logical command line or whether it was a continuing keystroke in a logic sequence or syntax, with proper branching to select a continuation processor which properly incorporates the keystroke into a previously initiated sequence or alternately to select the appropriate initializing processor which creates the first statement in a logical sequence. After appropriate processing, the processor 22 examines the flags set by the interrupt processing and branches accordingly to one of four sequence steps.

If a legal sequence or statement has been completed, the processor sets an operator command request flag in the main loop processing such that the processor 22 processes the inserted function for execution upon encountering the processing request flag in the main loop processing.

If, in a program mode, the processor transfers the loaded line buffer to the program storage area or memory bank 34. The processor 22 also resets the main loop processing request flag and then restores the internal registers and returns from the interrupt. If not in the program mode, the processor returns from the interrupt with the loop processing request flag set to execute the statement in the sequence of FIG. 5.

If the service of the keystroke completed the input to the command line, the processor also steps to the program mode decision and branches according to whether in a program mode or not. The command, for example, may include a single operator command keystroke such as the cursor movement input key in which case the keystroke is executed directly in the keystroke processor rather than in the main loop. If in program mode such direct processing is suppressed but appropriate flags are set for later incorporation in the keystroke program as just explained.

If the command line is incomplete, the processor conditions the processor for input continuation to permit completion of the command line, and then restores the internal registers and returns from interrupt to the main processor loop. If an illegal command or error results from the processed keystroke, the cancel request flag is set. The processor 22 also may write the memory of the alpha-numeric generator 31 to visually display the error on screen 5 as well as energizing the illegal command lamp of the lamp bank 65. The processor then restores the internal registers and returns from interrupt back to the main processor loop.

In the same sequence, each keystroke is processed, stored where appropriate for part of a completed logical statement, and/or stored as part of the "learn" program for subsequent automated running.

In the illustrated embodiment of the invention, the P cursor 61 is also employed to define the location about which expansion of a waveform is executed in response to expansion controls 55b provided on panel 11. The user selects the point about which expansion shall occur. As shown in FIGS. 1 and 2, the expansion factor controls include a pair of vertical pushbuttons or keys 120 and 121 and a pair of horizontal pushbuttons or keys 122 and 123 to permit expansion by a factor of one-half or two in each coordinate direction. The keys 120–123 provide for multiple actuation to increase the multiplication factor. For example, eight actuations may be provided with automatic wrap around the ninth time. Each actuation of an expansion key 120–123 increases the expansion factor up to a total of thirty-two maximum. The processor 22 in processing the actuation of the expansion keys, first calculates the offset values required to position the P cursor 61 at the center of the CRT screen 5 using the gain factor selected by the user. The values are calculated for each quadrant and placed in appropriate registers in the display generator memory table 30. A horizontal axis offset value is also calculated and stored.

The display interface will then, in retrieving the data memory, select the appropriate data array $Q_1$–$Q_4$ and each point or location data is passed through expansion hardware provided as part of the display generator 123a of interface unit 27, for example, as schematically shown in FIG. 7. The memory table 30, as diagrammatically shown in FIG. 7, includes five registers 124 receiving the gain and offset values of each quadrant or array $Q_1$–$Q_4$ plus one for the horizontal axis. The table is written by the processor 22 and the outputs are read by a "subtract" module 125 and by a "Shift" module 126 respectively. The memory array data is passed through the modules to generate the data to be displayed. Each data value is therefore appropriately offset and multiplied to develop an accurate display of the expanded waveform about the centered P cursor 61. The expanded data value is connected to an off-scale checking circuit 127, shown as a part of the display generator 123a. The off-scale check circuit 127 also receives inputs 128 and 129 from the expansion computation circuits 125 and 126 from which it determines whether a given display point will be on-scale. If an off-scale value is received, circuit 127 blanks intensity circuit 130. The intensity circuit 130 is actuated to intensify the CRT beam after it has settled at the appropriate location on the screen 5. The visual waveform on the screen is therefore expanded by the offset and multiplier factor only to the extent that the expanded waveform is contained within the viewing portion of the screen 5.

The expansion sequence may be incorporated into a keystroke program by introduction of the appropriate keystrokes of the expansion control elements and the cursor location into the sequence, as previously, generally discussed with respect to the "learn" state of the instrument. Further, in connection with the user operated keys and the other interactive keys of the panels 11 and 20, the cursor control keys 81-88 can be combined in a keystroke program in the memory 34 to provide for automatic calculation and waveform analysis of continuing waveform by capturing and displaying time spaced samples of the waveform with the programmed analysis.

The appropriate programmed movement of the cursors 61 and 62 during the analysis of a waveform permits the instrument to automatically and rapidly calculate and store relevant data in memory.

One example of the use of the described instrument will be given to illustrate the power and wide applicability of the disclosed device. The development of the invention did not have as the specific object an instrument to perform the particular described analysis but it none-the-less lends itself fto such an analysis with essentially the same ease and convenience as if it was a special purpose device designed only for this particular analysis. It is just as easily programmed to do any number of other analyses in many other fields of scientific investigation not related to medicine, the area chosen for this example.

The cardiac cycle waveform, such as shown in FIG. 8, is widely used for analysis of the human heart and in particular by comparing of the waveform 132 and its changes with known standards. The cardiac cycle waveform 132 of a damaged heart will generally be similar to the basic pattern, with the differences residing in the size and spacing of the primary deflections. Thus, the waveform includes a series of five deflections, conventionally labeled in sequence from left to right as P, Q, R, S, T and each related to a known functioning part of the heart, which provides a basis for knowledgeable analysis.

The present invention, particularly with the keystroke programming can provide for direct rapid analysis of a series of the cardiac cycle waveform, by defining areas of the waveform for analysis and then recording the results.

The one cursor 61 is placed to the left side of the trace or waveform 132 by the horizontal set and vertical level set keys 83 and 84. The vertical level set key 83 is used to move the cursor 61 to the first major deflection of the ECG waveform. The cursor 61 is then programmed to move to the local maximum of the waveform via the local maximum key 87 to locate the P pulse or deflection 133. The cursor 62 can be located on the leading edge of the large R pulse or deflection 134 by the horizontal and vertical level set keys 83' and 84'. The cursor 62 is similarly moved to a local maximum by key 87' and the R pulse 134 located. Actuation of the coordinate key 94 records the coordinate location and the height can be calculated and stored in selected data registers 75 by keystroke programming of appropriate register keys 74 such as register keys A and B. The values can, of course, be displayed during the analysis. Programming to move the cursors 61 and 62 to local minima by the keys 88 and 88' provides programmed machine assisted movement of the cursors to the Q and S deflections 135 and 136. By actuating the delta coordinates key 94, the width of the R pulse 134 is measured. The value can be stored in any data register 75 by actuating the register array keys 74 such as C register 75. The ratio of the height and width of the R pulse may be readily calculated by keystroke programming division of the height and width registers 75, with the value stored in another register. The derivative of the cardiac cycle waveform 132 may be programmed by use of the derivative key acting on the memory array Q1 and the results stored in array $Q_2$ with simultaneous display as at 137. The peak defines the maximum rate of rise on the leading edge of the R pulse 134. Other evaluations and calculations can of course be programmed.

The keystroke program continues to cycle and analyze the waveform with the crucial values stored and displayed.

The dual cursors 61 and 62 in combination with the calculating function controls and more particularly the arithmetic function keys and the several compound mathematical function keys permit many other and widely generalized forms of waveform analysis.

In summary, the unique interactive keyboard with the multiple function keys, preferably identified by the well-known conversational symbols encountered in the art of waveform analysis, significantly expands the capability and convenience of using a waveform measuring and analyzing instrument such as a digital oscilloscope or a transient recorder. The combination of the interactive keyboard with the keystroke programming further increasing the capability and power for analysis made available to the user for rapid, accurate and in depth study of changing waveforms. The unique multiple cursor means with the multiple user operator key for manual positioning in combination with particular machine assisted positioning further increases the usefulness of the instrument and particularly the other interactive user operated keystroke controls in analysis of waveforms and in on-site data reduction and calculation for a full and more complete investigation.

Various modes of carrying out the invention are contemplated as being within the scope of the following claims, particularly pointing out and distinctly claiming the subject matter which is regarded as the invention.

I claim:

1. A waveform measuring and analyzing instrument having a visual display means comprising digitized memory array means for storage of the coordinates for the visual display means in digitized form, a data acquisition means connected to said memory means for establishing a digitized representation of a waveform, a programmed processor having a program memory, and an interactive user operated control means having a plurality of keystroke means for each of a plurality of basic arithmetic functions of addition, subtraction, multiplication and division and for each of a plurality of compound mathematical functions for reduction and calculation involving the waveform data signals in the memory array means, said program memory including programs for each of said keystroke means, and said processor including means responsive to actuation of said keystroke means to invoke the corresponding program.

2. In the waveform measuring and analyzing instrument of claim 1 having identifying indicia for each of said keystroke means corresponding to the conventional mathematical symbol for the function executed by the corresponding program.

3. In the waveform measuring and analyzing instrument of claim 1 wherein said data acquisition means, said processor means and said interactive user operated control means are located in a common support housing unit.

4. The waveform measuring and analyzing instrument of claim 1 including a plurality of cursor means, said control means including keystroke means for selective positioning of the cursor on a displayed waveform and second keystroke means for positioning of the cursors on a displayed waveform in accordance with a preselected waveform characteristic.

5. The waveform measuring and analyzing instrument of claim 4 wherein said second keystroke means includes first means programmed to respond to a local maximum point of the waveform and second means programmed to respond to a local minimum point.

6. The instrument of claim 5 including third keystroke means programmed to control cursor set registers and operable for introducing of coordinate values in the set registers and for positioning of the cursors in accordance with the coordinate values in the set registers.

7. In the waveform measuring and analyzing instrument of claim 1 wherein said memory array means includes a plurality of individual arrays, said memory array means includes a controller having a control memory for controlling the connection to said data acquisition means, said controller having logic routing means for selectively introducing of the waveform signals into selected arrays and the logic routing means being controlled by the said controller in accordance with the program table established by said processor, said user operated control means including input means for selectively displaying said individual arrays and for selectively executing programmed mathematical calculations with the data in each location within selected arrays.

8. The waveform measuring and analyzing instrument of claim 1 wherein said user operated control means includes a data acquisition timing control means, a data acquisition mode selection means for selecting one of a plurality of different input modes, and said processor being operable to write program tables for each of said modes, said memory array means including a controller actuated by said program table to correspondingly actuate said data acquisition means.

9. In the instrument of claim 1 wherein said memory array means includes a memory controller for establishing the connection of a memory array means to the data acquisition means, to the processor and to the display means, said display means including a controller for establishing connection of a display driver to the memory array means and to the processor, and said processor writing tables for said memory controller and for said display controller.

10. In the instrument of claim 9 wherein said memory array means includes hardwired connecting means to said data acquisition means and to said display means, said connecting means including logic routing means controlled by said tables.

11. In the instrument of claim 9 wherein said display means includes an alphanumeric generating means for generating the alphanumeric characters for display in accordance with the display controller.

12. In the instrument of claim 1 including individual keystroke means for selection of the stored data in said memory array means and for selection of the arithmetic function and for developing single valued results.

13. In the instrument of claim 12 including storage register means for storing a single valued result of any one of said sequences, and said processor means being operable to display said registers.

14. In the instrument of claim 12 wherein selected individual keystroke means for said compound mathematical functions, invoke programs including instrument selected data from said memory array means and instrument selected designation storage means to store the results of said calculation and reduction.

15. The waveform measuring and analyzing instrument of claim 14 having a plurality of value storage registers, said user operated control means includes key means for transferring a calculation by said mathematical calculation keystroke means to a storage register, and said processor including means to selectively display the value in said storage registers.

16. In the instrument of claim 1 wherein said memory controller establishes a data memory priority with highest priority to said data acquisition means, and second and third priorities to the processor and display means.

17. In the instrument of claim 16 wherein the processor has the second priority.

18. In the instrument of claim 1 wherein said waveform memory array means includes a plurality of input means defining the division of the memory unit to form a plurality of individual memory arrays, said processor includes storage means for processor calculated data, and said interactive control means includes
  a group of numeric entry key inputs covering the digits zero through nine,
  a group of keystroke mathematical operator keys for selection of basic arithmetic functions and single and multiple point calculus functions, and including a general transmittal function,
  a group of keystroke storage keys operable to select a storage means for the processor calculated data for data inputting or outputting by said processor therewith,
  a group of keystroke memory array selection keys for selection of inputting or outputting by said processor with said memory array means for display, and
  a group of keystroke display control keys operable conjointly with said memory selection keys for selection and formation of said display of said waveform memory array means.

19. In the instrument of claim 1 wherein said processor includes data storage means, said interactive control means includes
  a group of numeric entry keys covering the digits zero through nine, a group of operator keys including basic mathematical arithmetic functions and single and multiple point calculus functions and including a general transmittal function, a group of storage keys operable to select a storage means for processor controller calculated values for data inputting or outputting by said processor therewith, a group of cursor positioning keys for positioning a plurality of cursors, a group of memory array selection keys for selection of inputting or outputting by said processor means with said memory array means for display and data reduction, and a group of display control keys operable conjointly with said memory selection keys and said storage keys for selection and formation of said display of said data memory bank means.

20. In the instrument of claim 19 including array registers for storing offset and factor values, said programs for said operator key inputs including means to set said array registers for corresponding modification of the data in each memory location in accordance with the function executed on said data.

21. In the instrument of claim 19 wherein said operator keys include a key to produce point averaging of said waveform, said storage keys and said numeric entry keys being operable to define the point averaging.

22. In the instrument of claim 19 wherein said operator keys include single keys for executing the derivative and integrals of the waveform in said memory means.

23. In the instrument of claim 19 wherein said operator keys include single keys for calculating the square root and the RMS values of memory arrays.

24. In the waveform instrument of claim 21 wherein said operator keys include a definite integral key operable to calculate the integral of the waveform array between the cursor locations.

25. In the waveform instrument of claim 19 wherein said operator keys include a rise time key operable to calculate the rise time of the waveform between the cursor positions.

26. In the waveform instrument of claim 19 wherein said operator keys include a peak-to-peak key operable to calculate the value between the highest and lowest peaks of a waveform.

27. In the waveform instrument of claim 19 wherein said operator keys include a peak area key operable to calculate the area of the waveform enclosed by the waveform and a straight line joining a pair of cursors.

28. In the waveform instrument of claim 19 including cursor coordinate keys for calculating and displaying the coordinates of said plurality of cursors.

29. In the waveform instrument of claim 19 including a delta coordinate key for calculating the difference in the coordinates of a pair of cursors and displaying the calculated difference.

30. In the instrument of claim 19 including a learn memory, a key programming group of keys operable to introduce a series of keystrokes into said learn memory related to data reduction and calculation of said waveform data in said memory means, and a run key to actuate said processor to read and execute the program in said learn memory.

31. In the instrument of claim 30 wherein said key programming group of keys includes statement selection means for directing the processor to any location in said learn memory, whereby a plurality of keystroke programs may be stored in said learn memory and selectively executed.

32. In the instrument of claim 30 wherein said instrument is selectively in a Normal state responsive to the key groups for data acquisition, manipulation and computation and for data display, said Learn state for storing of a series of keystrokes in the learn memory, a Run state in which the processor is executing a program in the learn memory, and a Pause state in which the processor program sequence is interrupted and operator controlled functions can be executed in the same manner as in the Normal state.

33. In the instrument of claim 32 wherein said Pause state is controlled by a user operated key and is operable in the Run state to halt the program at the next Pause statement in the program, and operable in the Learn state to introduce the Pause statement in the keystroke program.

34. In the instrument of claim 33 including a keylock means operable to operatively disable all of the several keys except a small number of keys, the actuation of which cannot in themselves directly alter the data or the internal program of the instrument.

35. In the instrument of claim 30 wherein said processor displays on the display means logical statements being entered into the learn memory and automatically advances to the next statement line upon completion of each logical statement, said learn programming keys including a cancel key operable to cancel any partial statement prior to the final keystroke in the statement, said programming keys including a "go to" location key for selecting any logical statement location, said statement being presented on the display means, said cancel key being operable to erase said statement.

36. In the instrument of claim 19 including a key programming group of keys including a learn key operable to place the processor in condition to store keystrokes in a learn memory means, said programming keys, a step key actuating the processor to step the next key program line, a pause key establishing a pause condition in said program, a "go to" key operable with said other key inputs to select a location in the key programming, a conditional branch key to place a branching compare statement in the key program, and a cancel key to delete a statement from the key program.

37. In the instrument of claim 19 including a key programming group of keys including a learn key opeable to place the processor in condition to store keystrokes in a learn memory means, a "go to" key operable with said other key inputs to select a location in the key programming, whereby a plurality of keystroke programs are storable in the learn memory means, and are selectively executed by the processor in response to user selection.

38. In the instrument of claim 1 wherein said processor includes a sequence memory means, said user operated control means includes sequence programming keystroke means for conditioning said processor to store a sequence of user actuated keystroke means in said sequence memory means, and including Run keystroke means to actuate said processor to execute the sequence of the keystrokes placed in said sequence memory means.

39. In the instrument of claim 38 wherein said programming keystroke means includes a learn input means to condition the processor, a series of storage register related input means, a transmittal input means, a conditional branch input means, a step input means, a pause input means and a run input means.

40. In the instrument of claim 38 wherein said programming keystroke means includes a Pause input means, and including keylock control means to selectively deactivate all of the user operated means except the Run key means and the Pause means.

41. A waveform measuring and analyzing instrument having a visual display means and comprising digitized memory array means for storage of the coordinates of the visual display means in digitized form, a data acquisition means connected to said memory means for establishing a digitized representation of a waveform, a programmed processor having a program memory for actuating said display means and said data acquisition means for selective placement of said digitized waveform signal in said memory array means, and an interactive user operated control means having a plurality of keystroke means for calculating with said memory array means and controlling the acquisition and display of the memory array means, and said processor means including offset and factor registers for each array location and storing of the appropriate modifying values for subsequent display and manipulation of such array, said processor modifying the data in the waveform memory array by said offset and factor registers for display and for data reduction.

42. The waveform measuring and analyzing instrument of claim 41 having a data acquisition means connected to the memory array means and having a signal input means, said data acquisition means having logic switch means connected to said signal input means, and said processor means including program means to sequentially activate said switch means to ground and to calculate the internal drift offset and store the value in said offset registers.

43. A waveform measuring and analyzing apparaus having a display means for visual display of information waveforms, comprising means for producing a plurality of cursors on said visual display means, and user operated control means for selectively positioning said cursors on said waveforms at arbitrarily selected positions on said waveform and at selected positions in accordance with the selected characteristic of the wave.

44. The instrument of claim 43 wherein said control means includes user operated keystroke means, and a programmed processing means to detect the relative position of said cursors and to move the cursors in accordance with the actuation of the keystroke means.

45. The apparatus of claim 43 wherein said control means includes first means to separately move the cursors along the waveform of the display means, second means to locate the cursors at a selected one of a first set of coordinates, third means to locate the cursors at a selected level of a second set of coordinates.

46. The apparatus of claim 43 wherein said display means includes a plurality of spaced display portions and means to locate different waveforms on said display portions, and said control means including fourth means to move the cursor between display portions, and thereby from one waveform to another waveform.

47. In a waveform measuring and analyzing instrument having display means for visual display of waveforms, comprising means for producing a plurality of cursors on said visual display means, cursor control means for selectively positioning said cursors on said waveforms at arbitrarily selected positions on said waveform and at selected positions in accordance with a selected characteristic of the waveform, and processing means to detect the relative position of said cursors and to analyze the waveform in accordance with the position of said cursors.

48. The instrument of claim 47 including means operable to analyze the waveform at a cursor coordinate and the waveform between said cursors.

49. In the instrument of claim 47 wherein said control means includes manual control elements for selectively positioning each of said cursors on said waveforms at arbitrarily selected positions and for continuously moving said cursors along said waveform.

50. In the instrument of claim 47 including a local maximum cursor element operable to move a cursor to the most adjacent maximum point of the waveform.

51. In the instrument of claim 47 including a local minimum cursor element operable to move a cursor to the most adjacent minimum point of the waveform.

52. The instrument of claim 47 wherein said control means includes a horizontal set element to locate a cursor at a selected horizontally defined coordinate of the waveform.

53. The instrument of claim 47 wherein said control means includes a vertical level element to locate a cursor at a selected vertically defined coordinate of the waveform.

54. The instrument of claim 47 wherein said display means includes a multiple array memory operable to display a plurality of different waveforms of the different arrays on said display means, said cursor control means include means to position said cursors on said waveforms and means to move the cursor from one waveform array to the same relative location on another waveform, and said processing means being operable to compare the data at said cursor locations.

55. In the instrument of claim 55 consisting of a pair of said cursors, said plurality of keystroke means including two groups of correspondingly operable keystroke means, each group being operable to control the positioning of one of said cursors.

56. In the instrument of claim 55 wherein said keystroke means include individual pushbutton keys for each selected cursor motion.

57. The instrument of claim 55 wherein said third keystroke means select a cursor register adapted to store a coordinate of a cursor, said instrument including numeric data register keystroke means and calculated data register keystroke means, and transmittal keystroke means to enter the data register value into said cursor register, operation of the cursor keystroke means automatically positioning said cursor to said coordinate value.

58. In the instrument of claim 57 wherein said third keystroke means includes a vertical set keystroke means and a horizontal set keystroke means.

59. In the instrument of claim 55 including keystroke means programmed to move the cursors to the absolute maximum and minimum vertical points on said waveform.

60. In a waveform measuring and analyzing instrument having a memory means for storing a digitized waveform signal and having display means for visual display of the digitized waveform signal, comprising means for producing a plurality of keystroke cursors, a plurality of means for selectively positioning said cursors on said display means including first keystroke means positioning said cursors in opposite directions on said waveform, second keystroke means for moving said cursor to positions in accordance with a selected characteristic of the waveform, third keystroke means for setting said cursors at selected memory locations on said display means, operator keystroke means for executing compound mathematical functions, and programmed processing means having programs for each of said keystroke means and programs for each operator keystroke means, means to establish a keystroke program to detect the relative position of said cursors and to position said cursors and to analyze the waveform as delimited by said cursors including programmed analysis of the waveform in accordance with the location of the cursors on said waveform.

61. The instrument of claim 60 wherein said memory means includes a plurality of arrays, said display means being operable to simultaneously display a plurality of different arrays in different portions of said display means, said control means including keystroke means to automatically position said cursors on one waveform array to the corresponding location on another, and said processing means being operable to compare said cursor located relative to a common reference.

62. In the instrument of claim 60 wherein said first keystroke means is operable from a first to a second position for moving said cursors from one memory location to an adjacent location on said waveforms, said first keystroke means continuously moving said cursors along said waveform in response to holding the first keystroke means in said second position.

63. In the instrument of claim 60 wherein said second keystroke means actuates the processor to invoke a program which searches for a local peak waveform point and moves a cursor to said point.

64. The instrument of claim 60 wherein said processing means include a keystroke memory means for storing the sequence of user operation of said keystroke means and defining an executable keystroke program of said processing means, and user operated keystroke means to actuate said processing means to execute said keystroke program for successive analysis of the displayed waveform.

65. A waveform measuring the analyzing instrument having a high speed monitoring CRT tube, digital memory array means for storage of the coordinates of waveform data in digitized form, a data acquisition means connected to said memory means for establishing digitized waveform signals of a live waveform, a programmed processor having a program memory for actuating said display means and said data acquisition means for selective placement of said digitized waveform signal in said memory array means, said processor including input data scaling registers, and an interactive user operated control means having a plurality of input means for each of a plurality of basic mathematical functions for reduction and calculation involving the data signals in the memory array means, a cursor means having input means for selective positioning on said display means, cursor register means, storage registers for storing single valued results of the operated controlled input means, learn means to generate a keystroke program of said input means, said processor being operable to execute said keystroke program, said program memory including programs for each of said inputs, and said processor including means responsive to actuation of said inputs to invoke the corresponding program, said processor including a main sequence loop including responding to execute arithmetic and operator function commands, demand register updates, sample the cursor registers and format for other program segments, update cursor display, update storage register display, update data transfer mode, execute internal keystroke program, establish learn mode.

* * * * *

UNITED STATES PATENT AND TRADEMARK OFFICE
CERTIFICATE OF CORRECTION

PATENT NO. : 4,072,851
DATED : February 7, 1978
INVENTOR(S) : FREDERICK A. ROSE

It is certified that error appears in the above-identified patent and that said Letters Patent are hereby corrected as shown below:

Column 4, Line 45, before "selected" cancel "updata" and insert --- update ---;

Column 5, Line 61, at the end of the line, after "signal" cancel "and" and insert --- the ---;

Column 11, Line 18, before "mode" cancel "ahd" and insert --- and ---;

Column 13, Line 15, before "for" cancel "date" and insert --- data ---;

Column 14, Line 19, at the end of the line, after "a" cancel "signal" and insert --- sign ---;

Column 14, Line 31, after "58," cancel "wich" and insert --- which ---;

UNITED STATES PATENT AND TRADEMARK OFFICE
CERTIFICATE OF CORRECTION

PATENT NO. : 4,072,851
DATED : February 7, 1978
INVENTOR(S) : FREDERICK A. ROSE

It is certified that error appears in the above-identified patent and that said Letters Patent are hereby corrected as shown below:

...continued...

Column 16, Line 16, after "one" cancel "quadarant" and insert --- quadrant ---;

Column 16, Line 51, after "acted" cancel "pon" and insert --- upon ---;

Column 18, Line 41, before "from" cancel "lne" and insert --- line ---;

Column 21, Line 53, before "34" cancel "bbank" and insert --- bank ---;

Column 22, Line 6, before "or" cancel "along" and insert --- alone ---;

Column 23, Line 27, before "related" cancel "nd" and insert --- and ---;

Column 24, Line 66, before "and" cancel "legel" and insert --- legal ---;

Column 27, Line 42, before "such" cancel "fto" and insert --- to ---;

UNITED STATES PATENT AND TRADEMARK OFFICE
CERTIFICATE OF CORRECTION

PATENT NO. : 4,072,851
DATED : February 7, 1978
INVENTOR(S) : FREDERICK A. ROSE

It is certified that error appears in the above-identified patent and that said Letters Patent are hereby corrected as shown below:

... continued ...

| | | | | |
|---|---|---|---|---|
| Column 31, CLAIM 19 | | Line | 6, | before "calculated" cancel "controller" and insert --- controlled ---; |
| Column 32, CLAIM 37 | | Line | 48, | at the end of the line, after "key" cancel "opea-" and insert --- oper ---; and |
| | | Line | 49, | at the beginning of the line, cancel "ble" and insert --- able ---; |
| Column 34, CLAIM 55 | | Line | 36, | after "claim" cancel "55" and insert --- 47 ---; |
| Column 36, CLAIM 65 | | Line | 6, | after "measuring" cancel "the" and insert --- and ---. |

Signed and Sealed this

First Day of August 1978

[SEAL]

Attest:

RUTH C. MASON
*Attesting Officer*

DONALD W. BANNER
*Commissioner of Patents and Trademarks*